US012772864B2

(12) United States Patent
Mayukh et al.

(10) Patent No.: US 12,772,864 B2
(45) Date of Patent: Oct. 20, 2026

(54) HYBRID SUBSTRATES AND MANUFACTURING METHODS THEREOF

(71) Applicant: Avago Technologies International Sales Pte. Limited, Singapore (SG)

(72) Inventors: Mayank Mayukh, Fort Collins, CO (US); Shrikara Prabhu Tendel, Singapore (SG); Jayanthi Pallinti, Los Gatos, CA (US); Gregory Dix, Fort Collins, CO (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 413 days.

(21) Appl. No.: 18/496,656

(22) Filed: Oct. 27, 2023

(65) Prior Publication Data

US 2025/0046622 A1 Feb. 6, 2025

Related U.S. Application Data

(60) Provisional application No. 63/517,747, filed on Aug. 4, 2023.

(51) Int. Cl.
*H10W 70/05* (2026.01)
*H10W 72/00* (2026.01)

(52) U.S. Cl.
CPC ......... *H10W 70/05* (2026.01); *H10W 70/095* (2026.01); *H10W 72/072* (2026.01)

(58) Field of Classification Search
CPC ..................................................... H10W 70/60
See application file for complete search history.

(56) References Cited

U.S. PATENT DOCUMENTS

| | | | | |
|---|---|---|---|---|
| 2001/0008309 | A1 | 7/2001 | Iijima et al. | |
| 2006/0163740 | A1 | 7/2006 | Ohno et al. | |
| 2006/0202322 | A1 | 9/2006 | Kariya et al. | |
| 2011/0314666 | A1 | 12/2011 | Harazono et al. | |
| 2012/0049368 | A1 | 3/2012 | Tanaka | |
| 2012/0068359 | A1 | 3/2012 | Mori et al. | |
| 2012/0246924 | A1 | 10/2012 | Hibino et al. | |
| 2012/0312590 | A1 | 12/2012 | Maeda et al. | |
| 2013/0062108 | A1 | 3/2013 | Kondo | |
| 2013/0093097 | A1* | 4/2013 | Yu ....................... | H10W 74/019 257/777 |
| 2013/0181354 | A1 | 7/2013 | Khan et al. | |

(Continued)

OTHER PUBLICATIONS

European Patent Office, Extended Search Report, Application No. 24191638.6, Dec. 23, 2024, 9 pages.

*Primary Examiner* — Yu-Hsi D Sun
(74) *Attorney, Agent, or Firm* — Quarles & Brady LLP

(57) ABSTRACT

The subject technology is directed to semiconductor devices and manufacturing methods. In various embodiments, the subject technology provides a method for manufacturing a semiconductor device, which comprises forming a substrate and coupling a first circuit to the substrate. The first circuit is characterized by a first coefficient of thermal expansion (CTE) and the substrate is characterized by a second CTE. A ratio of the first CTE to the second CTE is greater than or equal to 3:5, which ensures harmonious thermal behavior, leading to improved yield and reduced warpage. In some implementations, one or more circuit elements may be embedded in the substrate. There are other embodiments as well.

20 Claims, 16 Drawing Sheets

(56) References Cited

U.S. PATENT DOCUMENTS

| | | | |
|---|---|---|---|
| 2014/0311771 | A1 | 10/2014 | Shimizu et al. |
| 2015/0155218 | A1 | 6/2015 | Hung et al. |
| 2015/0179560 | A1 | 6/2015 | Arisaka et al. |
| 2015/0245478 | A1 | 8/2015 | Miyazawa et al. |
| 2015/0245486 | A1 | 8/2015 | Shin et al. |
| 2015/0357276 | A1 | 12/2015 | Shimizu et al. |
| 2016/0057863 | A1 | 2/2016 | Kyozuka |
| 2016/0172287 | A1 | 6/2016 | Arisaka et al. |
| 2017/0018492 | A1 | 1/2017 | Imayoshi et al. |
| 2019/0333837 | A1 | 10/2019 | Kang et al. |
| 2019/0385989 | A1 | 12/2019 | Yu et al. |
| 2020/0006214 | A1 | 1/2020 | Tsai et al. |
| 2020/0043908 | A1 | 2/2020 | Chung et al. |
| 2020/0118898 | A1 | 4/2020 | Hu |
| 2020/0211945 | A1 | 7/2020 | Huang et al. |
| 2020/0303314 | A1 | 9/2020 | Kang et al. |
| 2020/0312767 | A1 | 10/2020 | Pietambaram et al. |
| 2020/0312770 | A1 | 10/2020 | Lu et al. |
| 2021/0327796 | A1 | 10/2021 | Chen et al. |
| 2022/0005793 | A1 | 1/2022 | Kang et al. |
| 2022/0037245 | A1 | 2/2022 | Hu |
| 2022/0037294 | A1 | 2/2022 | Hwang et al. |
| 2022/0189880 | A1 | 6/2022 | Pietambaram et al. |
| 2022/0302009 | A1 | 9/2022 | Wu et al. |
| 2022/0328388 | A1 | 10/2022 | Hwang et al. |
| 2023/0085411 | A1* | 3/2023 | Paital ...................... H01L 24/19 257/621 |
| 2023/0369191 | A1 | 11/2023 | Ramakrishnan et al. |

* cited by examiner

HYBRID SUBSTRATES AND MANUFACTURING METHODS THEREOF

CROSS-REFERENCES TO RELATED APPLICATIONS

This application claims priority to U.S. Provisional Application No. 63/517,747, filed Aug. 4, 2023, which is commonly owned and incorporated by reference herein for all purposes.

FIELD OF INVENTION

The subject technology is directed to semiconductor devices and manufacturing methods.

BACKGROUND OF THE INVENTION

Over the past few decades, semiconductor packaging materials and processes have evolved. As high-performance computing and associated applications advance, there emerges a pressing need for substrates that can cater to heightened integration demands. Various approaches involve heterogeneous integration, which allows for the integration of different types of devices (e.g., silicon and/or memory components) on a single package. However, it remains a challenging task to ensure seamless communication, efficient high-density routing, and effective integration of both active and passive components onto the substrates.

Various approaches for enhanced substrates have been explored, but they have proven to be insufficient. It is important to recognize the need for new and improved substrates and their manufacturing processes.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
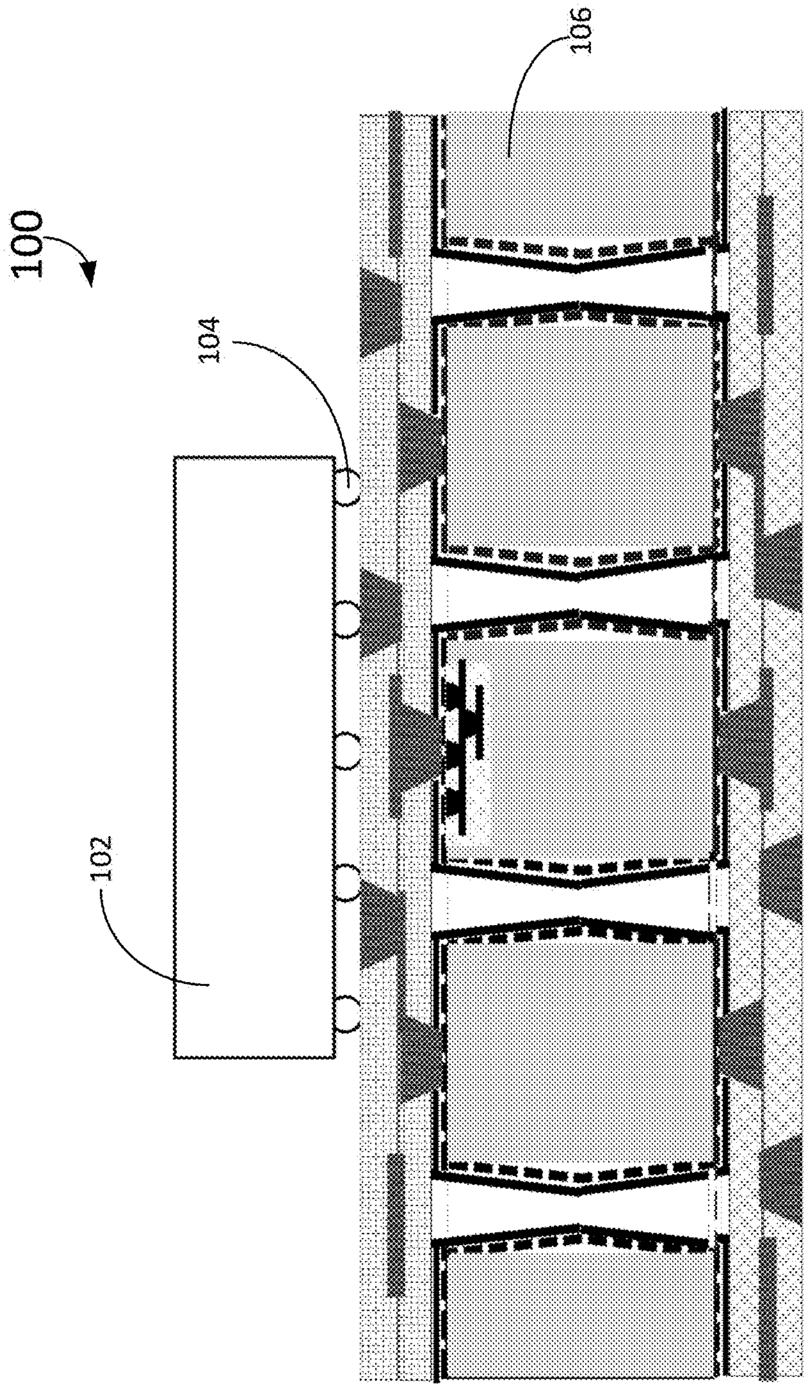
FIG. 1 is a simplified diagram illustrating a semiconductor device having a substrate according to the embodiments of the subject technology.

The subject technology is directed to semiconductor devices and manufacturing methods. In various embodiments, the subject technology provides a method for manufacturing a semiconductor device, which comprises forming a substrate and coupling a first circuit to the substrate. The first circuit is characterized by a first coefficient of thermal expansion (CTE) and the substrate is characterized by a second CTE. A ratio of the first CTE to the second CTE is greater than or equal to 3:5, which ensures harmonious thermal behavior, leading to improved yield and reliability and reduced warpage. In some implementations, one or more circuit elements may be embedded in the substrate. There are other embodiments as well.

As previously noted, various methods for semiconductor fabrication have proven to be insufficient to meet the demands of high-computing applications. For example, some approaches involve using silicon interposers as substrates, which are constrained by the size of the reticle mask in lithography, facing limitations in size and complexity. Further, interposers are typically passive and they tend to one more layer or complexity and CTE mis-match between the IC Chip and the substrate. Further, interposer adds an additional layer of thermal resistance, which is detrimental to the device performance. Co-packaging requires low warpage because the optics is very sensitive to dimensional tolerances. Hybrid substrates not only eliminate interposers but also provide a low warpage package solution necessary to enable co-packaging. Co-packing includes integration of photonics and electronic integrated circuit (IC) to convert signal from electron to photon and vice-versa and using optical fibers to run traffic from and to the package. Co-packaging may also include using passive copper cables instead of photonic devices.

On the other hand, various techniques involve using organic substrates to provide support and electrical connections to IC chips. However, a challenge arises from the significant difference in coefficients of thermal expansion (CTE) between the IC chip and the organic substrate. The term "coefficient of thermal expansion" may refer to a measure of how much a material expands or contracts when subjected to temperature changes. For instance, an IC chip-which is usually made of silicon—may have a CTE of less than 3 ppm/° C., while organic substrates may have higher CTE values ranging from 10 to 16 ppm/° C. Such CTE mismatch may lead to potential warpage and subsequent structural reliability challenges, such as cracks, delamination, or solder joint failures.

In various embodiments, the subject technology introduces systems and methods for producing hybrid substrates. For instance, hybrid substrates may be characterized by an asymmetric configuration, which combines the interposer-like structure on one side with the organic substrate-like structures on the other side. Among others, hybrid substrates address the challenges of reticle-limited interposers, the current state-of-the-art, allowing for high-density routing to meet the demands of high-performance applications. Manufacturing methods of the subject technology streamline fabrication processing by integrating different structures in a single process flow, which allows for reduced manufacturing steps and shorter production durations. The subject technology addresses the CTE mismatch issues at the manufacturing stage, thereby substantially reducing defects like warpage, delamination, and solder joint failures. This results in higher yields, minimized wastage, and better resource utilization. Moreover, embodiments of the subject technology are suited for co-packaging active and passive components with computing and memory devices for enhanced performance.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the subject technology is not intended to be limited to the embodiments presented, but is to be accorded the widest scope consistent with the principles and novel features disclosed herein.

In the following detailed description, numerous specific details are set forth in order to provide a more thorough understanding of the subject technology. However, it will be apparent to one skilled in the art that the subject technology may be practiced without necessarily being limited to these specific details. In other instances, well-known structures and devices are shown in block diagram form, rather than in detail, in order to avoid obscuring the subject technology.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

When an element is referred to herein as being "connected" or "coupled" to another element, it is to be understood that the elements can be directly connected to the other element, or have intervening elements present between the elements. In contrast, when an element is referred to as being "directly connected" or "directly coupled" to another element, it should be understood that no intervening elements are present in the "direct" connection between the elements. However, the existence of a direct connection does not exclude other connections, in which intervening elements may be present.

When an element is referred to herein as being "disposed" in some manner relative to another element (e.g., disposed on, disposed between, disposed under, disposed adjacent to, or disposed in some other relative manner), it is to be understood that the elements can be directly disposed relative to the other element (e.g., disposed directly on another element), or have intervening elements present between the elements. In contrast, when an element is referred to as being "disposed directly" relative to another element, it should be understood that no intervening elements are present in the "direct" example. However, the existence of a direct disposition does not exclude other examples in which intervening elements may be present.

Similarly, when an element is referred to herein as being "bonded" to another element, it is to be understood that the elements can be directly bonded to the other element (without any intervening elements) or have intervening elements present between the bonded elements. In contrast, when an element is referred to as being "directly bonded" to another element, it should be understood that no intervening elements are present in the "direct" bond between the elements. However, the existence of direct bonding does not exclude other forms of bonding, in which intervening elements may be present.

Likewise, when an element is referred to herein as being a "layer," it is to be understood that the layer can be a single layer or include multiple layers. For example, a conductive layer may comprise multiple different conductive materials or multiple layers of different conductive materials, and a dielectric layer may comprise multiple dielectric materials or multiple layers of dielectric materials. When a layer is described as being coupled or connected to another layer, it is to be understood that the coupled or connected layers may include intervening elements present between the coupled or connected layers. In contrast, when a layer is referred to as being "directly" connected or coupled to another layer, it should be understood that no intervening elements are present between the layers. However, the existence of directly coupled or connected layers does not exclude other connections in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." In this application, the use of the singular includes the plural unless specifically stated otherwise, and use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

One general aspect includes a method for manufacturing a semiconductor device, which comprises forming a substrate, and coupling a first circuit to the substrate. The first circuit is characterized by a first coefficient of thermal expansion, the substrate is characterized by a second coefficient of thermal expansion, a ratio of the first coefficient of thermal expansion to the second coefficient of thermal expansion is greater than or equal to 3:5. A method for forming the substrate comprises providing a base layer, the base layer comprising a first side and a second side. The method further comprises coupling a first wafer to the second side. The method further comprises forming a first via in the base layer. The method further comprises depositing a first layer on the first side, the first layer comprising a first dielectric material. The method further comprises forming a first wiring in the first layer. The method further comprises depositing a second layer on the first layer. The method further comprises forming a first connection in the second layer, the first circuit being coupled to the substrate via the first connection.

Implementations may include one or more of the following features. The first connection comprises a conductive pad. The first connection comprises a metal bump. The substrate is characterized by a first thickness, the base layer is characterized by a second thickness, and the second thickness is greater than 60% of the first thickness. The base layer comprises a glass material, a ceramic material, a diamond material, or a silicon material. The method further comprises depositing a third layer on the substrate, the third layer being coupled to the first via. The third layer comprises a titanium nitride material, a tungsten material, a silicon oxide material, or a copper material. The first dielectric material comprises a polyimide material or a silicon nitride material. The second layer comprises a passivation material. The method further comprises coupling a second wafer to the second layer, and detaching the first wafer from the base layer. The method further comprises depositing a fourth layer on the second side, the fourth layer comprising a second dielectric material. The second dielectric material is different from the first dielectric material. The method further comprises forming a second wiring in the fourth layer, the second wiring comprising a metal material.

According to another embodiment, the subject technology provides a method for manufacturing a semiconductor device. The method comprises forming a substrate, and coupling a first circuit to the substrate. The first circuit is characterized by a first coefficient of thermal expansion, the substrate is characterized by a second coefficient of thermal expansion, a ratio of the first coefficient of thermal expansion to the second coefficient of thermal expansion is greater than or equal to 3:5. A method for forming the substrate comprises providing a base layer, the base layer comprising a first side and a second side. The method further comprises coupling a first wafer to the second side. The method further comprises forming a first via in the base layer. The method further comprises forming a cavity in the base layer, the cavity being positioned on the first side. The method further comprises embedding a second circuit in the cavity. The method further comprises depositing a first layer on the first side, the first layer comprising a first dielectric material. The method further comprises forming a first wiring in the first layer. The method further comprises depositing a second layer on the first layer. The method further comprises forming a first connection in the second layer, the first circuit being coupled to the substrate via the first connection.

Implementations may include one or more of the following features. The second circuit comprises a memory, a thermal component, a mechanical component, an optical component, or an electrical component. The substrate is characterized by a first thickness, the base layer is characterized by a second thickness, and the second thickness is greater than 60% of the first thickness. The first layer is characterized by a third thickness, the third thickness is less than or equal to 30 um. The base layer comprises a glass material, a ceramic material, a diamond material, or a silicon material.

According to yet another embodiment, the subject technology provides a method for manufacturing a semiconductor device, which comprises providing a base layer, the base layer comprising a first side and a second side. The method further comprises coupling a first wafer to the second side. The method further comprises forming a first via in the base layer. The method further comprises depositing a first layer on the first side, the first layer comprising a first dielectric material. The method further comprises forming a first wiring in the first layer. The method further comprises depositing a second layer on the first layer. In some embodiments, the method further comprises embedding a circuit in the base layer.

FIG. 1 is a simplified diagram illustrating a semiconductor device 100 having a substrate according to the embodiments of the subject technology. This diagram is merely an example, which should not unduly limit the scope of the claims. One of ordinary skill in the art would recognize many variations, alternatives, and modifications. As shown, semiconductor device 100 includes circuit 102. For example, circuit 102 may include an integrated circuit such as a microprocessor, memory chip, digital signal processor, system-on-chip (SoC), or the like.

Depending on the implementation, circuit 102 may include, without limitation, a memory, a thermal component, a mechanical component, an optical component, or an electrical component, active and passives devices, die stacks, etc. For instance, the term "memory" may refer to a device that can store data for immediate or future use. The memory may include, without limitation, a static random access memory (SRAM), a dynamic random access memory (DRAM), or hybrid bandwidth memory (HBM), a voltage regulator, a capacitor, an inductor, or the like, and it should limited the scope of the claims. The term "thermal component" may refer to a device that generates, transfers, or dissipates heat. The thermal component may include, without limitation, a heater, a heat sink, a thermoelectric generator, a thermal pad, or the like, and it should not limit the scope of the claims. The term "mechanical component" may refer to a device that contributes to the physical and structural integrity or movement functionalities within the semiconductor device, and it should not limit the scope of the claims. Mechanical components may include, without limitation, a microelectromechanical system (MEMS) device, an actuator, a sensor, an oscillator, or the like. The term "optical component may refer to a device that manages, generates, or detects light, including but not limited to devices that convert electrons to photons or vice versa or devices that generate or transmit laser. The optical components may include, without limitation, a lens, a waveguide, a photon modulator, a photonic integrated circuit, an II-V semiconductor, a light source, a light detector, integrated lasers, or the like. The term "electrical component" may refer to a device that conducts, insulates, or switches electricity, and it should not limit the scope of the claims. Electrical components can be active or passive. The active electrical components may include, without limitation, a transistor, a diode, an integrated circuit, or the like. Passive electrical components may include, without limitation, a resistor, a capacitor, an inductor, or the like.

In various examples, circuit 102 may be characterized by a first coefficient of thermal expansion (CTE). The term "coefficient of thermal expansion" may refer to a measure of how much a material expands or contracts when subjected to temperature changes. CTE can be expressed in units of parts per million per degree Celsius (ppm/° C.). It can be measured using various methods, such as dilatometry, interferometry, thermomechanical analysis, strain gauges, Direct Image Correlation (DIC) or the like. It is to be appreciated that CTE is an important factor that affects the reliability and performance of semiconductor packages, as discrepancies in CTE values between adjoining materials can introduce thermal stress and deformation, leading to potential reliability problems. The CTE value of a material may be associated with various factors, such as material composition, microstructure, impurities, temperature range, or the like. In various embodiments, circuit 102 includes a silicon material and the first CTE can be modulated and in some cases may be less than 3 ppm/° C.

According to some embodiments, semiconductor device 100 further includes substrate 106 coupled to circuit 102. For instance, substrate 106 is coupled to circuit 102 through joint 104. The term "substrate" may refer to a material that provides support and electrical connections for electronic components. The substrate may also provide a means for connecting an IC chip (e.g., circuit 102) to the external circuitry (e.g., a PCB board). Substrate 106 may include, without limitation, one or more materials such as silicon, organic materials, ceramics, diamonds, or any combination thereof. The term "joint" may refer to an electrical or mechanical connection between the IC chip and the substrate. Joint 104 may include a solder-based joint (e.g., micro bumps) or a solderless joint (e.g., hybrid or direct copper bonds).

Depending on the implementation, substrate 106 may be a hybrid substrate. The term "hybrid" indicates that the substrate combines features and properties of multiple, distinct types of materials and/or structures. In some examples, substrate 106 includes a first structure (e.g., an interposer-like structure) located at a first side (e.g., a front side) and a second structure (e.g., an organic substrate-like structure) located at a second side (e.g., a backside) or vice versa. The first side may be opposite to the second side or vice versa. The first structure may provide a dense, electrically conductive network allowing for high-density routing, ensuring efficient communication across semiconductor device 100. In some cases, the first structure may include the electrical and thermal properties of silicon, which ensures efficient signal transmission and heat dissipation. The second structure may be suited for the integration and co-packaging of both active and passive components, providing flexibility and adaptability for enhancing overall system performance. The hybrid substrate may be symmetric or asymmetric. For instance, both sides can be interposer and substrate like or one side may be interposer like and the other side may be substrate like.

In various implementations, substrate 106 may be characterized by a second CTE. For instance, a ratio of the first CTE to the second CTE is greater than or equal to 3:5. By closely matching the CTEs of substrate 106 and circuit 102, the risks associated with thermal stresses-such as warping or delamination—are mitigated, enhancing both the reliability and longevity of semiconductor device 100. In some cases, substrate 106 may be coupled to other components (e.g., a printed circuit board) via mechanisms like solder balls, bumps, or the like.

Figure 2:
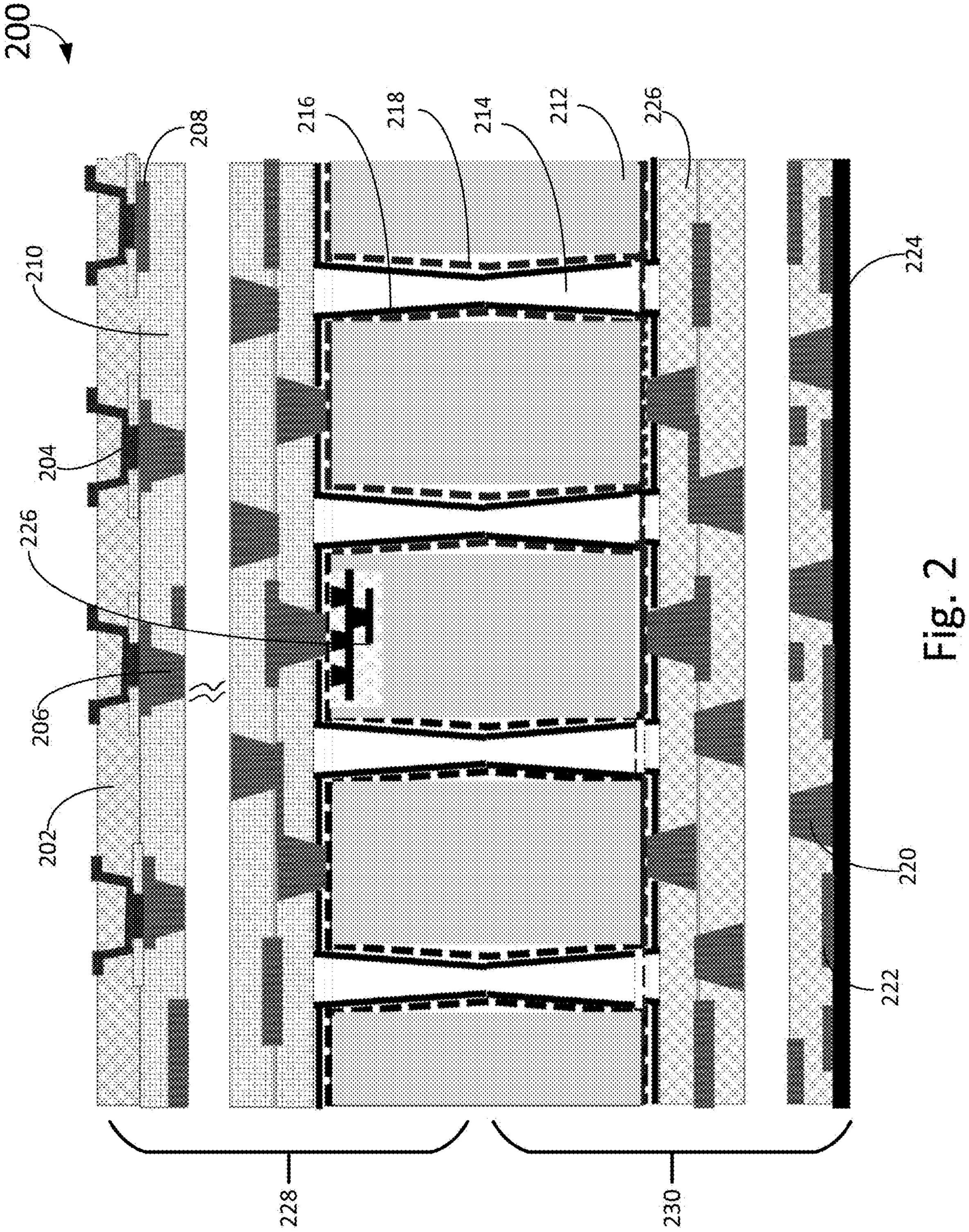
FIG. 2 is a simplified diagram illustrating a substrate of a semiconductor device according to the embodiments of the subject technology.

FIG. 2 is a simplified diagram illustrating a substrate 200 of a semiconductor device according to the embodiments of the subject technology. This diagram is merely an example, which should not unduly limit the scope of the claims. One of ordinary skill in the art would recognize many variations, alternatives, and modifications.

As shown, substrate 200 includes layer 202. For instance, layer 202 may serve as a passivation layer. The term "passivation layer" may refer to a layer of material that is deposited on the surface of a semiconductor device to protect it from environmental factors (e.g., moisture, oxygen, contaminants, etc.). Layer 202 may include a passivation material, which may include, without limitation, one or more materials such as an organic material (e.g., polyimide, parylene, benzocyclobutene, etc.), an inorganic material (e.g., silicon nitride, silicon dioxide, silicon carbide, etc.), or the like.

Depending on the implementation, layer 202 may be configured to couple to an external circuit (e.g., circuit 102 of FIG. 1). For instance, layer 202 may be coupled to the external circuit via a first joint (e.g., joint 104 of FIG. 1). Layer 202 may include connection 204. The term "connection" may refer to a mechanism or structure that enables electrical or physical linkage between different components (e.g., between the external circuit and layer 202). Connections may include, without limitation, ultra-fine pitch bumps (uBumps), hybrid copper bonding (HCB), wiring bonding, flip-chip bonding, or the like. For example, the term "uBump" or "ultra-fine pitch bump" may refer to a type of solder bump that has a very small diameter (e.g., less than 25 um) and pitch (e.g., less than 40 um) and may be used to connect an IC chip and a substrate in a semiconductor package. Hybrid copper bonding may include bonding between copper or other metals (e.g., gold, etc.) and dielectric materials, which can be organic (e.g., small molecules or monomers, etc.) or inorganic (e.g., silicon oxide, other metal oxides, etc.).

In some embodiments, layer 210 may be coupled to layer 202. For instance, layer 210 may include a dielectric layer.

The term "dielectric layer" may refer to a non-conductive layer of material that is used to insulate different electrical components and pathways to ensure that electrical currents are directed as intended. Layer 210 may include a first dielectric material, which includes, without limitation, one or more materials such as an organic material (e.g., build-up film, polyimide, or other polymer-based dielectrics), an inorganic material (e.g., silicon nitride, silicon dioxide, silicon carbide, etc.), or the like. The composition, thickness, and number of dielectric layers can be tailored to meet specific requirements and may differ depending on the application.

In various implementations, layer 210 may include a first wiring. The first wiring may be coupled to layer 212. The term "wiring" may refer to electrically conductive pathways configured to facilitate electrical connections between components or regions in the semiconductor device. Wirings can be made using a variety of materials, such as copper, aluminum, gold, or the like. For instance, the first wiring may include via 206, which may be filled with various materials including, without limitation, copper, aluminum, gold, or the like.

In some cases, via 206 may be fabricated using copper plating. Depending on the implementation, a tapering ratio of via 206 can vary between 80% and 100%. For example, a tapering ratio of 80% may indicate that the diameter of the via at the top is 80% of the diameter of the via at the bottom. In some examples, the first wiring includes conductive trace 208. The term "conductive trace" may refer to a strip of conductive material that is used to connect electrical components. Conductive traces may include, without limitation, one or more materials such as copper, aluminum, gold, or the like. The dimensions and configurations (e.g., width, length, or thickness) of conductive trace 208 may vary depending on the application.

According to some embodiments, layer 212 may be coupled to layer 210. Layer 212 may include, without limitation, one or more materials such as glass, ceramic, diamond, silicon, or the like. For instance, layer 212 may include via 214. The term "via" may refer to an opening or hole in a substrate that allows electrical connection between different layers of the substrate. Vias may include, without limitation, through silicon via (TSV), through glass vias (TGV), through ceramic vias (TCV), through diamond vias (TDV), or the like. Via 214 may be formed using various techniques including, without limitation, laser drilling, mechanical drilling, chemical etching, or the like. For instance, diameters of via 214 at opposite sides may be the same or different, depending on the drilling approach. In some cases, via 214 may be drilled from opposite sides (e.g., a top side and a bottom side) of layer 212, which may result in a tapered via. A tapering ratio of via 214—which may be defined as a difference between the top area and the middle or bottom area of the via—may be adjusted, depending on the specific application. For example, a tapering ratio of via 214 may range from 80% to 100%. In various examples, via 214 may be filled with a conductive material (e.g., copper, tungsten, titanium, aluminum, gold, silver, tin, nickel, lead, or the like) to ensure electrical conductivity and structural integrity.

In some embodiments, layer 212 further includes layer 216 coupled to via 214 and layer 218 coupled to layer 216. For instance, layer 218 may include a seed layer, which is configured to facilitate copper deposition to ensure optimal connectivity and conductivity within substrate 200. Layer 218 may include, without limitation, one or more materials such as titanium nitride, tungsten, silicon oxide, copper, or the like. Layer 216 may include a via-electroplated layer, which may be deposited on the walls of a via (e.g., via 214) by using an electrochemical process. Layer 216 may be configured to create a conductive path between different layers and to fill via 214 with metal materials. This can improve the electrical performance, reliability, and thermal management of the semiconductor device. Layer 216 may include, without limitation, one or more materials such as copper, organic resin, or the like. In some cases, layer 212 further comprises a circuit 226. Circuit 226 may include active and/or passive components, which may be embedded within substrate (e.g., layer 212) to enhance signal integrity and overall performance of the semiconductor device. For instance, circuit 226 may include, without limitation, a memory, a thermal component, a mechanical component, an optical component, an electrical component, or the like.

In various examples, layer 226 may be coupled to layer 212. For instance, layer 226 may include a dielectric layer. Layer 210 may include a second dielectric material, which includes, without limitation, one or more materials such as an organic material (e.g., build-up film, polyimide, or other polymer-based dielectrics), an inorganic material (e.g., silicon nitride, silicon dioxide, silicon carbide, etc.), or the like. The composition, thickness, and number of dielectric layers can be tailored to meet specific requirements and may differ depending on the application.

In various implementations, layer 226 may include a second wiring. The second wiring may be coupled to layer 212. For instance, the second wiring may include a via 220, which may be filled with various materials including, without limitation, copper, aluminum, gold, or the like. Via 220 may be fabricated using copper plating. Depending on the implementation, a tapering ratio of via 220 can vary between 80% and 100%. In some examples, the second wiring includes a conductive trace 222. Conductive traces may include, without limitation, one or more materials such as copper, aluminum, gold, or the like. The dimensions and configurations (e.g., width, length, or thickness) of conductive trace 222 may vary depending on the application. In some embodiments, layer 226 may be coupled to layer 224, which may include a solder resist material. The term "solder resist material" may refer to a layer of material that is applied to the surface of printed circuit boards (PCBs) and semiconductor packages to protect the circuit pattern from solder and other contaminants. Solder resist materials may include, without limitation, one or more materials such as epoxy resin, acrylate resin, polyimide resin, or the like.

As previously noted, it is advantageous to closely match the CTE values of substrate 200 and the external circuit (e.g., circuit 102 of FIG. 2) to mitigate risks associated with thermal expansion mismatches, which can lead to thermal stress and structural challenges like delamination and warpage. In various implementations, layer 212 plays an important role in configuring the thermal expansion characteristics (e.g., CTE) of substrate 200. For instance, due to its thickness and material composition, layer 212 has a dominant effect on the substrate's thermal expansion behavior. In some examples, layer 212 accounts for more than 60% of the total thickness of substrate 200, making it the primary determinant of the substrate's CTE (e.g., the second CTE). For example, substrate 200 may be characterized by a first thickness, layer 210 may be characterized by a second thickness, and layer 212 may be characterized by a third thickness. The third thickness may be greater than 60% of the first thickness. Accordingly, a CTE value of layer 212 may be associated with the second CTE. In some cases, the third thickness is greater than 100 um and less than 2000 um.

The second thickness may be less than or equal to 30 um. Layer 226 may be characterized by a fourth thickness, which may be less than or equal to 30 um.

In various embodiments, substrate 200 may be characterized by an asymmetrical configuration. The term "asymmetrical" indicates that different sections or regions of substrate 200 have distinct properties or configurations. In various examples, first region 228 and second region 230 are positioned at opposite sides of substrate 200. First region 228 may be characterized by features associated with silicon interposers. For example, first region 228 provides fine-pitched electrical interconnects, which enable high-density routing and efficient connections across the semiconductor device. Second region 230 may be characterized by features associated with organic substrates. For instance, second region 230 provides flexibility and enhanced thermal management capabilities, allowing for seamless integration of both passive and active components. Such a configuration improves CTE matching by strategically combining the rigidity of a silicon-rich region and the flexibility of an organic-rich region, which collectively minimize thermal stresses and mitigate risks like delamination and warping. The asymmetrical configuration ensures high-density electrical interconnections and optimal thermal management while aligning seamlessly with existing assembly processes. For instance, the fabrication of substrate 200 may be achieved by masking one side, processing the other, and then repeating a similar process on the other side.

Figure 3A:
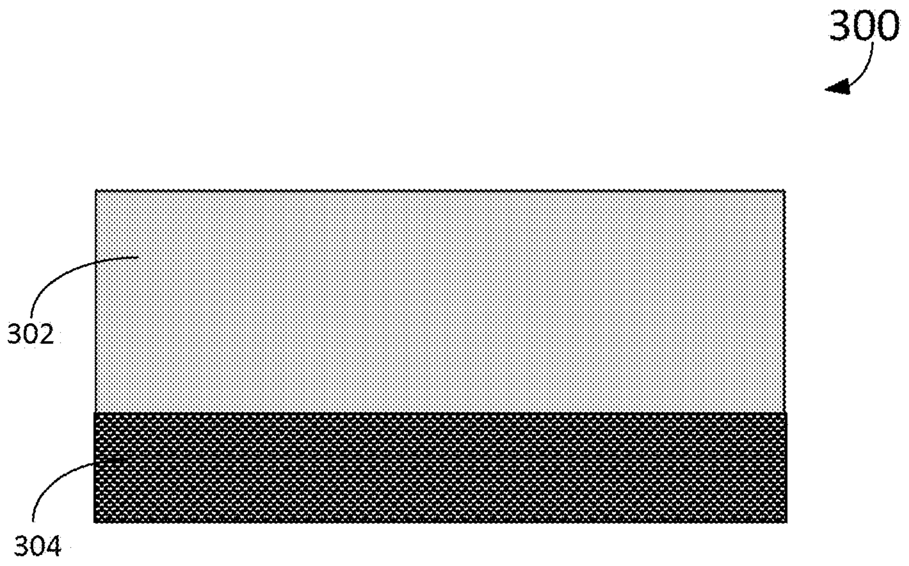
FIGS. 3A-3B are simplified diagrams illustrating a base layer of a semiconductor substrate according to embodiments of the subject technology.
Figure 3B:
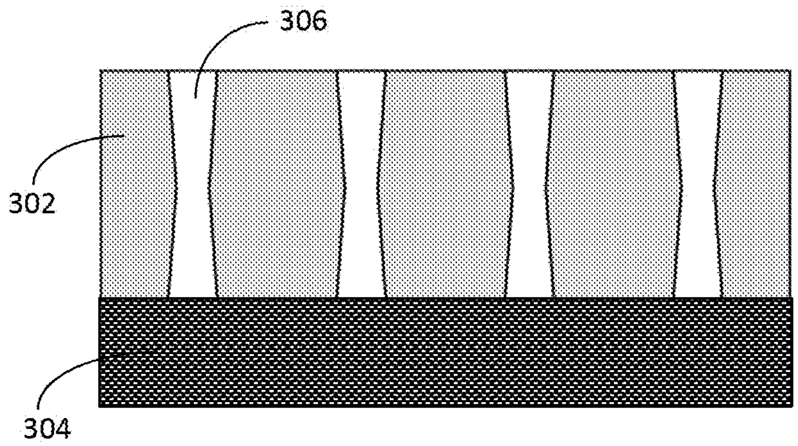

FIGS. 3A-3B are simplified diagrams illustrating a base layer of a semiconductor substrate 300 according to embodiments of the subject technology. These diagrams are merely examples, which should not unduly limit the scope of the claims. One of ordinary skill in the art would recognize many variations, alternatives, and modifications.

As shown in FIG. 3A, base layer 302 is coupled to wafer 304 (e.g., a first wafer recited in claim 1). For instance, wafer 304 may be coupled to base layer 302 by adhesive and/or other mechanisms. As an example, the term "base layer" may refer to a base material on which further processing may be performed. The base layer may be configured to provide support and facilitate the integration of various components and structures. Depending on the implementation, base layer 302 may include one or more layers of materials that are conducive to specific electrical, thermal, and mechanical properties essential for the optimal performance and functionality of the integrated devices. For instance, base layer 302 may be characterized by a high modulus (e.g., greater than 100 GPa) and/or a low CTE (e.g., less than 10 ppm/° C.) to ensure stability and reliability during both the manufacturing process and the operational lifecycle of the semiconductor device. In various examples, base layer 302 may include, without limitation, at least one or more materials such as glass, glass composite, ceramic, diamond, diamond composite, silicon, or the like. In some cases, base layer 302 includes a first side (e.g., a front or top side) and a second side (e.g., a back or bottom side). A thickness of base layer 302 can be adjusted according to the design and function of the semiconductor device. In various examples, base layer 302 is characterized by a thickness of greater than 100 um and less than 2000 um.

In some embodiments, wafer 304 may include a carrier wafer. The term "wafer" or "carrier wafer" may refer to a material or device that holds and protects the semiconductor die during processing, storage, or transport. For example, wafer 304 may be coupled to one side (e.g., the second side) of base layer 302 to shield or mask that side during subsequent processing steps. This enables selective processing of the unmasked side of base layer 302, thereby resulting in the desired asymmetrical structure. There are different types of wafers depending on the packaging technology and application. For example, wafer 304 may include one or more materials such as organic material, core material, glass material, and/or the like. Depending on the particular application, wafer 304 may possess attributes such as heat dissipation capabilities, identification codes, alignment marks, or other features.

Depending on the implementation, as shown in FIG. 3B, via 306 may be formed in base layer 302. Via 306 may be configured to provide various functions including, without limitation, vertical interconnection, signal transmission, power distribution, heat dissipation, mechanical support, or the like. Via 306 may include, without limitation, through silicon via (TSV), through glass vias (TGV), through ceramic vias (TCV), through diamond vias (TDV), or the like. Depending on the material of the base layer and the desired properties of the via, via 306 may be formed using various techniques including, without limitation, laser drilling, mechanical drilling, chemical etching, mold sintering, 3D printing, or the like. In various examples, via 306 may be filled with a conductive material (e.g., copper, tungsten, titanium, aluminum, gold, silver, tin, nickel, lead, or the like) to ensure electrical conductivity and structural integrity. In certain cases, via 306 is initially formed as a through hole, and may be subsequently revealed during later stages of the manufacturing process. The number and configuration of the vias may depend on the specific implementation. For example, via 306 may include a straight, sloped, angled, curved, or stepped sidewall.

Figure 4A:
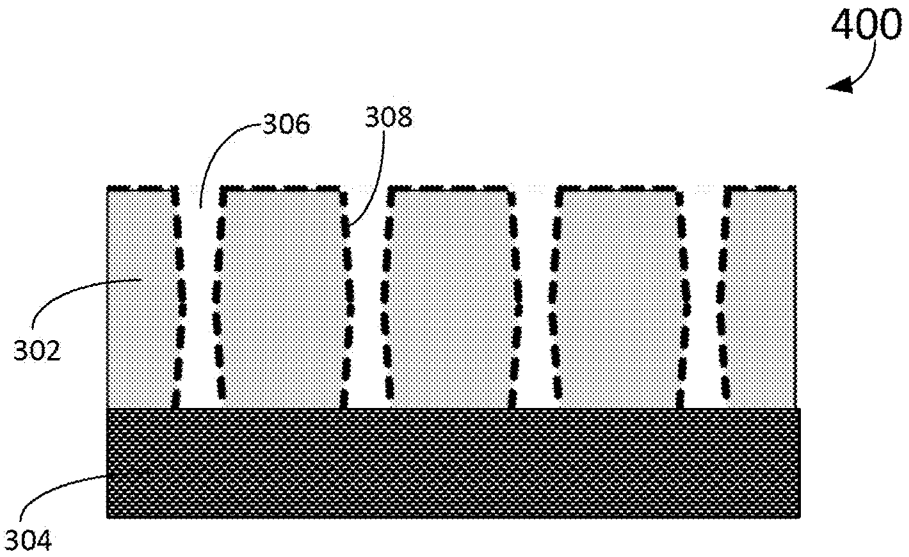
FIGS. 4A-4B are simplified diagrams illustrating a process of depositing one or more layers on a base layer of a semiconductor substrate according to embodiments of the subject technology.
Figure 4B:
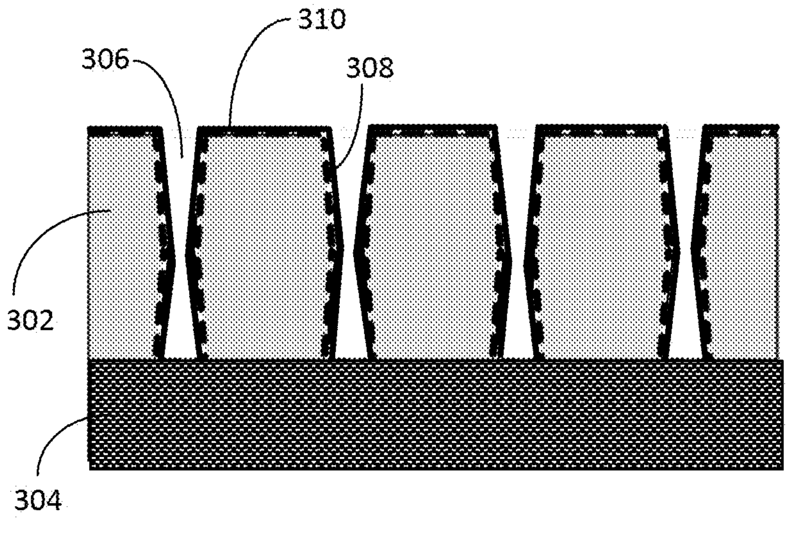

FIGS. 4A-4B are simplified diagrams illustrating a process of depositing one or more layers on a base layer of semiconductor substrate 400 according to embodiments of the subject technology. These diagrams are merely examples, which should not unduly limit the scope of the claims. One of ordinary skill in the art would recognize many variations, alternatives, and modifications.

As shown in FIG. 4A, after forming via 306, layer 308 may be deposited on base layer 302. For instance, layer 308 may be coupled to via 306. For instance, layer 308 may include a seed layer, which is configured to facilitate copper deposition to ensure optimal connectivity and conductivity within substrate 400. Layer 308 may serve as a template for the subsequent electroplating or electroless plating of metal to fill via 306. Depending on the implementation, layer 308 may be one or more layers, which may include, one or more materials such as titanium nitride, tungsten, silicon oxide, copper, gold, nickel, or the like. Depending on the desired thickness and uniformity, layer 308 may be deposited using various techniques including, without limitation, physical vapor deposition (PVD), chemical vapor deposition (CVD), atomic layer deposition (ALD), or the like. For instance, PVD involves depositing a thin film of material onto a substrate by vaporizing the source material and then depositing that material onto the substrate. CVD involves depositing a thin film of material onto a substrate by reacting a gas containing the desired material over the substrate. ALD involves depositing a thin film of material onto a substrate by alternating pulses of a precursor gas and a reactant gas. In some cases, layer 308 includes a barrier layer, which is configured to prevent the diffusion of metal atoms into the base layer, which can cause electrical shorting or reliability issues. For example, the barrier layer may include, without limitation, tantalum, tantalum nitride, titanium, titanium nitride, or the like.

In various implementations, as shown in FIG. 4B, layer 310 may be deposited on layer 308. For instance, layer 310 may include a via-electroplated layer, which may be deposited on the walls of a via (e.g., via 306) by using an electrochemical process. For instance, layer 310 may be deposited via an electroplating process, in which a conductive metallic film is deposited by the reduction of a metal ion from a solution onto a conductive surface (e.g., layer 308). Layer 310 may be configured to create a conductive path between different layers and to fill via 306 with metal materials. This can improve the electrical performance, reliability, and thermal management of the semiconductor device. Layer 310 may include, without limitation, one or more materials such as copper, organic resin, or the like.

Figure 5:
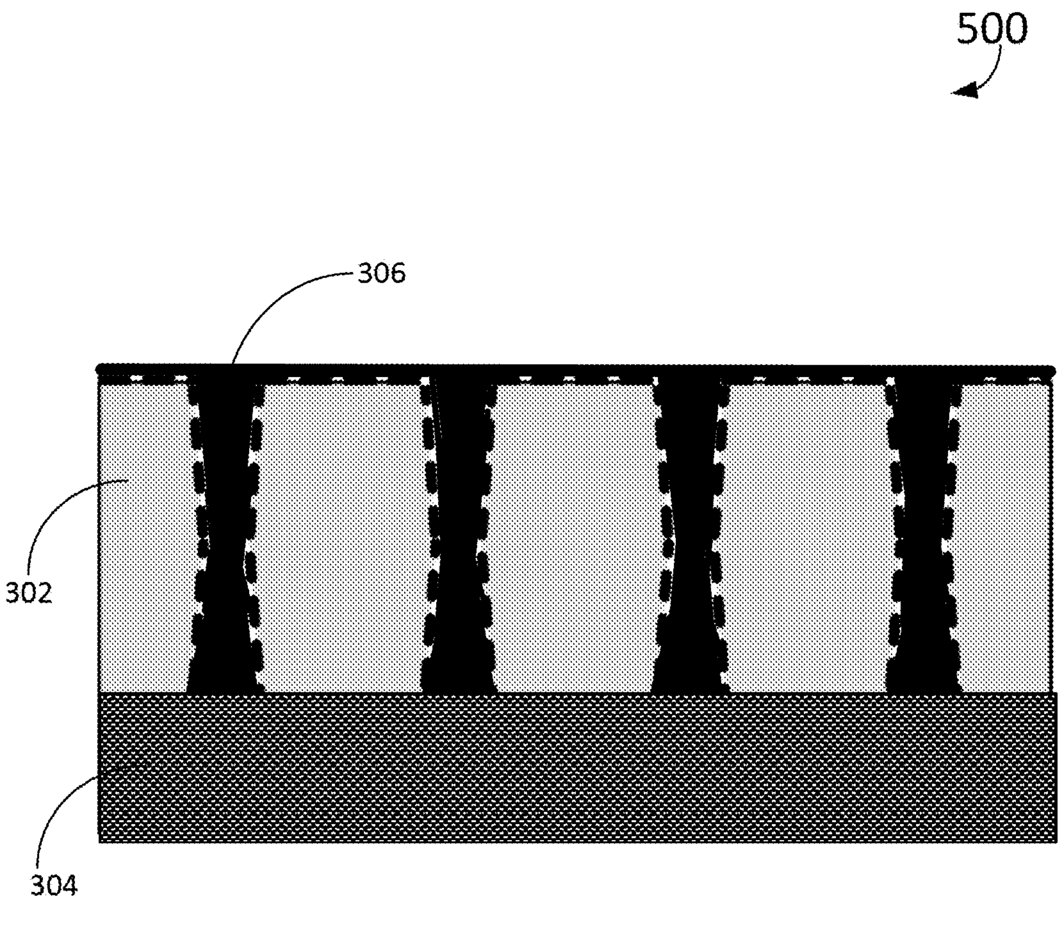
FIG. 5 is a simplified diagram illustrating a planarization process for manufacturing a semiconductor substrate according to embodiments of the subject technology.

FIG. 5 is a simplified diagram illustrating a planarization process for manufacturing a semiconductor substrate 500 according to embodiments of the subject technology. This diagram is merely an example, which should not unduly limit the scope of the claims. One of ordinary skill in the art would recognize many variations, alternatives, and modifications. As shown in FIG. 5, via 306 may be filled with various materials including, without limitation, copper, aluminum, gold, resin, or the like. For instance, via 306 may be filled through an electroplating or electroless plating process to establish an electrical connection between different layers of the semiconductor device. Once via 306 is filled, a planarization process may be performed to remove any excess material from the surface of substrate 500. For instance, planarization may be performed using a mechanical or chemical process. Mechanical planarization involves using a rotating polishing wheel to remove the excess material. Chemical planarization involves using a chemical solution to etch away the excess metal. Planarization reduces parasitic capacitance and resistance, improving the electrical performance and reliability of the semiconductor device. By ensuring a uniform and level surface, the planarization process also enhances alignment and precision during subsequent lithography steps.

Figure 6A:
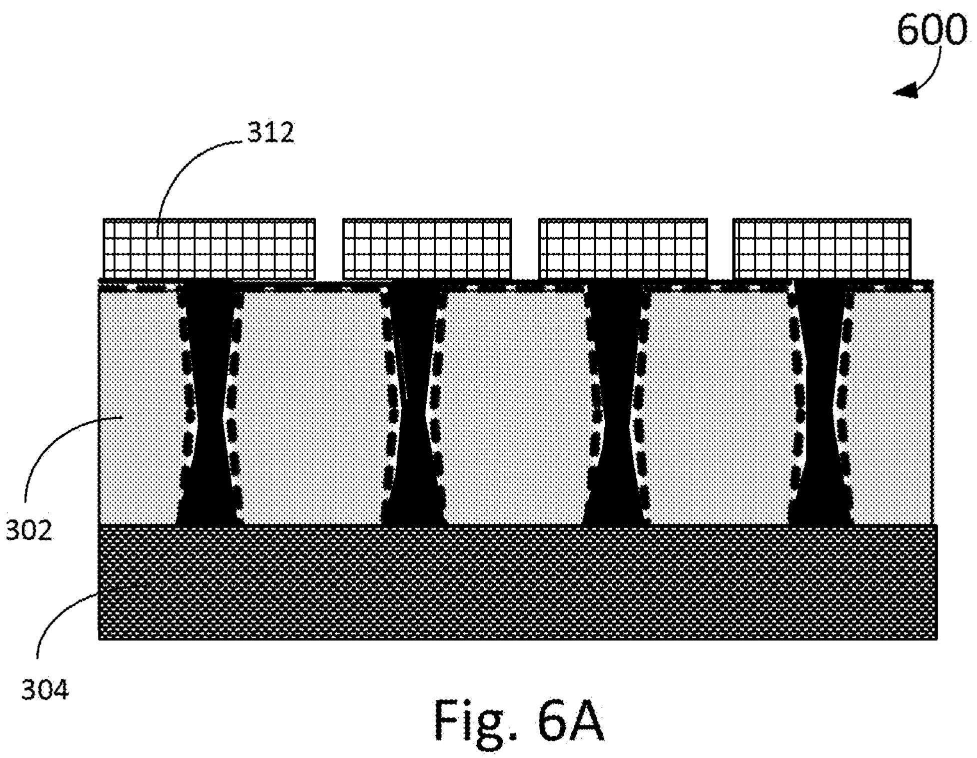
FIGS. 6A-6B are simplified diagrams illustrating a photolithography process for manufacturing a semiconductor substrate according to embodiments of the subject technology.
Figure 6B:
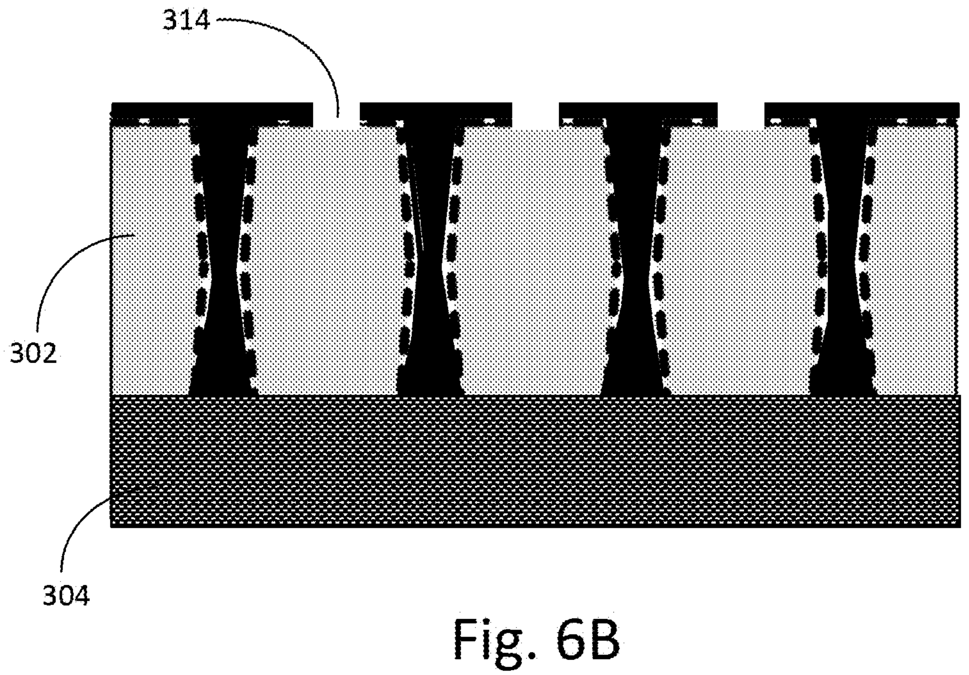

FIGS. 6A-6B are simplified diagrams illustrating a photolithography process for manufacturing a semiconductor substrate 600 according to embodiments of the subject technology. This diagram is merely an example, which should not unduly limit the scope of the claims. One of ordinary skill in the art would recognize many variations, alternatives, and modifications. As an example, the term "photolithography" refers to a process that uses light to transfer the pattern from the photomask to a photosensitive material, such as photoresist, that is coated on the wafer surface. Alternatively, nano-imprint lithography may be used to imprint features directly on the wafer utilizing specialized organic materials capable of retaining the imprint dimensions and tolerances upon curing.

As shown in FIG. 6A, substrate 600 may be coated with a photoresist, which may refer to a light-sensitive material that changes its properties when exposed to light. Photoresist may include, without limitation, phenolic resins, diazo resins, polyimide resins, metal oxides, or the like. In various examples, photomask 312 may be coupled and aligned to substrate 600 (e.g., the first side). The term "photomask" may refer to a transparent plate that has a pattern of opaque regions that block the light. Photomask 312 aids in creating precise patterns for the upcoming layers, such as vias and conductive traces. Maintaining proper alignment between photomask 312 and substrate 600 is important for precise pattern transfer, which ensures the semiconductor device's functionality and connectivity in later phases. Substrate 600 may later be exposed to a light source (e.g., ultraviolet light) through photomask 312 to create desired patterns for the next layer. As shown in FIG. 6B, pattern 314 may be created to serve as a template for subsequent fabrication steps. For instance, to establish reliable connections and seamless integration among different components, pattern 314 may be used to form various structures including, without limitation, interconnects, wires, electrical contacts, conductive traces, vertical connections, vias, conductive pads, or the like.

Figure 7A:
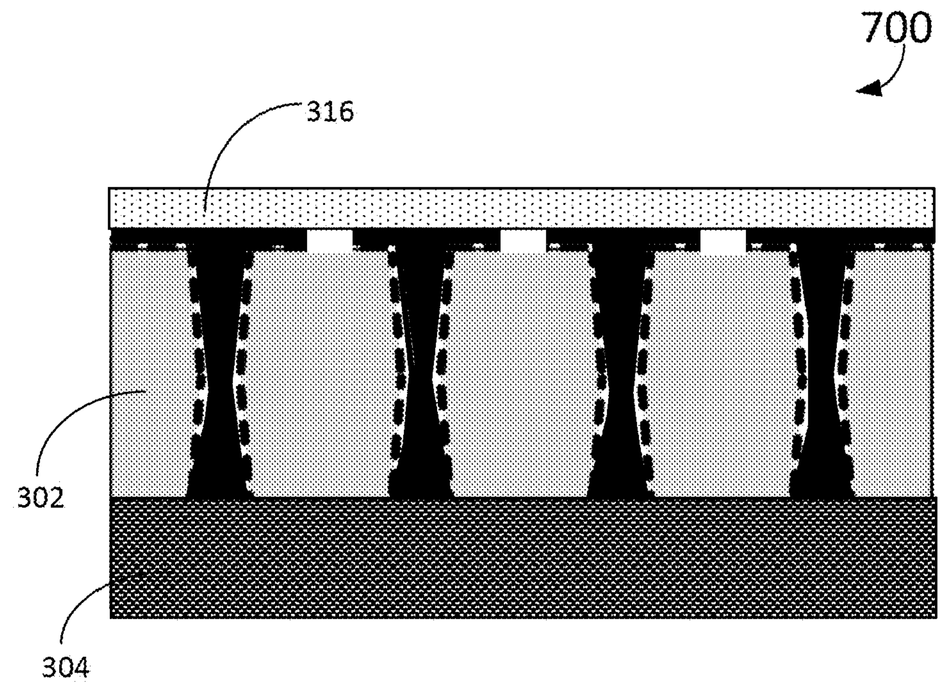
FIGS. 7A-7C are simplified diagrams illustrating one or more dielectric layers of a semiconductor substrate according to embodiments of the subject technology.
Figure 7B:
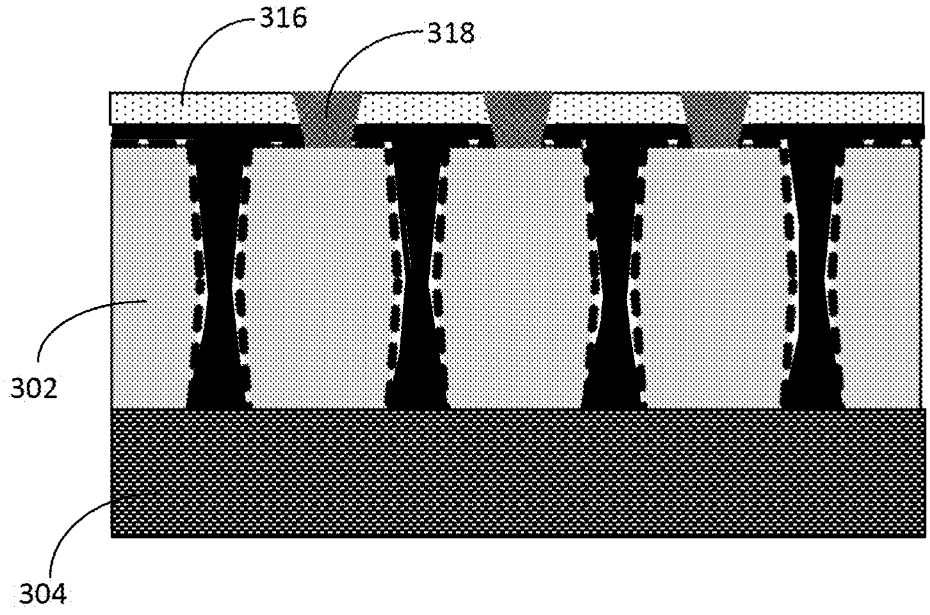
Figure 7C:
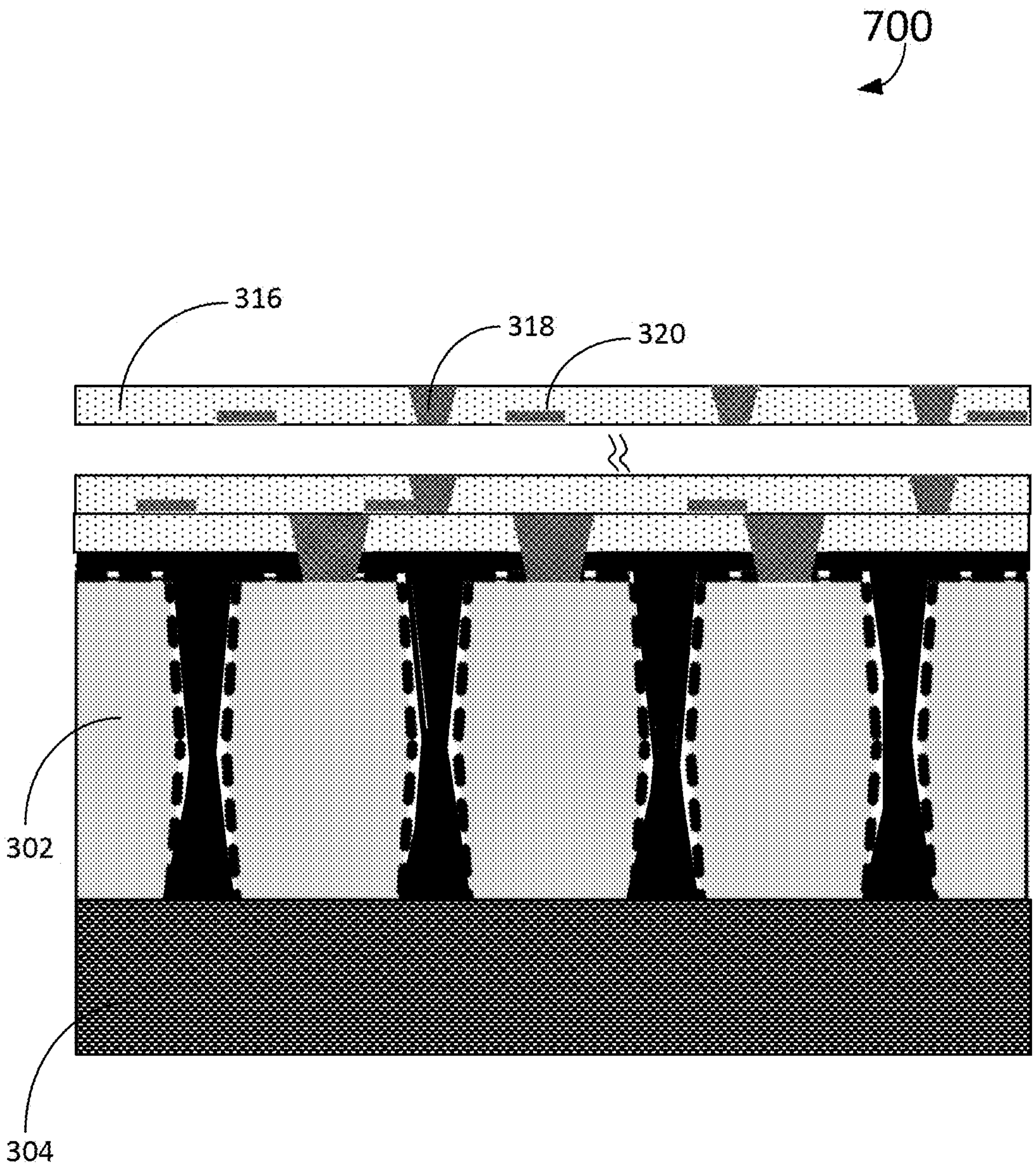

FIGS. 7A-7C are simplified diagrams illustrating one or more dielectric layers of a semiconductor substrate 700 according to embodiments of the subject technology. These diagrams are merely examples, which should not unduly limit the scope of the claims. One of ordinary skill in the art would recognize many variations, alternatives, and modifications. As shown in FIG. 7A, layer 316 may be deposited on base layer 302 (e.g., the first side of base layer 302). Layer 316 may be configured to provide electrical insulation between different components. For instance, layer 316 may include a dielectric layer. Layer 316 may include a first dielectric material, which includes, without limitation, one or more materials such as an organic material (e.g., build-up film, polyimide, or other polymer-based dielectrics), an inorganic material (e.g., silicon nitride, silicon dioxide, silicon carbide, etc.), or the like. Depending on the implementation, layer 316 may be formed using various techniques including, without limitation, CVD, PVD, ALD, or the like.

In various implementations, a first wiring may be formed in layer 316 to provide various functions and capabilities, such as signal transmission, power distribution, heat dissipation, or the like. The first wiring may be made using a variety of materials including, without limitation, one or more materials such as copper, aluminum, gold, or the like. For instance, as shown in FIG. 7B, the first wiring may include via 318, which may be filled with various materials including, without limitation, copper, aluminum, gold, or the like. Via 318 may be configured to establish vertical connections among different components, allowing for seamless electrical communication within the semiconductor device. Via 318 may be formed using various techniques, such as photolithography and etching, laser drilling, damascene, or the like. The number and configuration of the vias may depend on the specific implementation. For example, via 318 may include a straight, sloped, angled, curved, or stepped sidewall. In some cases, a tapering ratio of via 318 can vary between 80% and 100%.

It is to be appreciated that the composition, thickness, and number of dielectric layers can be tailored to meet specific requirements and may differ depending on the application. For example, as shown in FIG. 7C, one or more layers 316 may be formed. The multiple layers may be stacked on top of each other. In some embodiments, the first wiring may include conductive trace 320. For instance, conductive trace 320 may be configured to establish horizontal electrical connections along layer 316. Conductive trace 320 may include, without limitation, one or more materials such as copper, aluminum, gold, or the like. The dimensions and configurations (e.g., width, length, or thickness) of conductive trace 320 may vary depending on the application. Conductive trace 320 may be formed using various techniques, such as photolithography and etching, laser drilling, damascene, or the like. In various implementations, via 318 and conductive trace 320 may be strategically coordinated to ensure consistent signal transmission and efficient power delivery within the semiconductor device. For instance, via 318 may connect conductive trace 320 among different layers. Such a configuration permits electrical signals to seamlessly transition between layers, facilitating advanced multilayer circuit design and 3D integration. In some cases, an endpoint of conductive trace 320 may overlap or be in close proximity to via 318, which enhances connection reliability and minimizes risks like short-circuit or signal interference.

Figure 8:
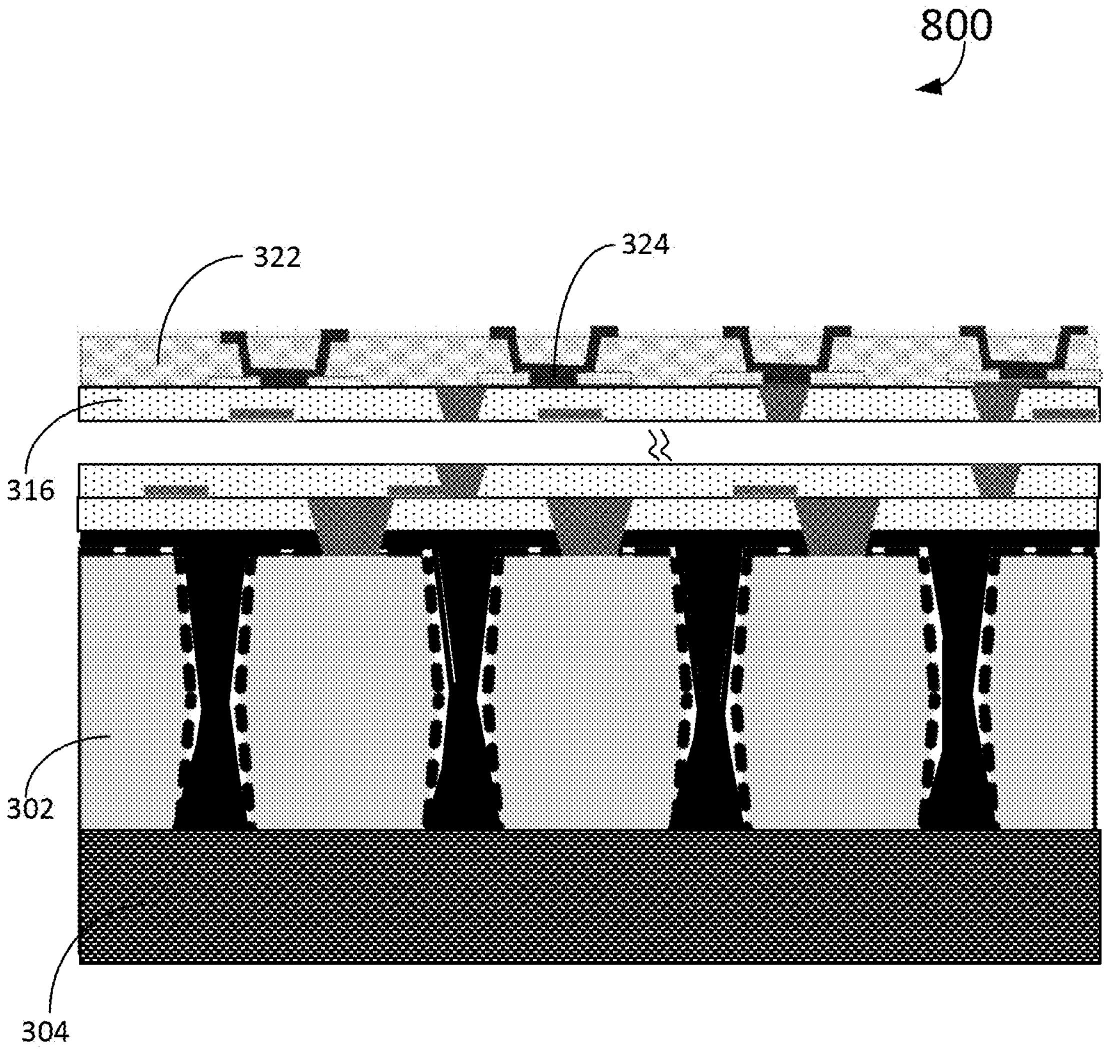
FIG. 8 is a simplified diagram illustrating a passivation layer of a semiconductor substrate according to embodiments of the subject technology.

FIG. 8 is a simplified diagram illustrating a passivation layer of a semiconductor substrate 800 according to embodiments of the subject technology. This diagram is merely an example, which should not unduly limit the scope of the claims. One of ordinary skill in the art would recognize many variations, alternatives, and modifications.

In various embodiments, layer 322 may be deposited on layer 316. For instance, layer 322 may be configured to protect the internal semiconductor device from environmental factors, such as moisture, impurities, mechanical damage, and/or the like. In some embodiments, layer 322 may include a passivation material, which may include, without limitation, one or more materials such as an organic material (e.g., polyimide, parylene, benzocyclobutene, etc.), an inorganic material (e.g., silicon nitride, silicon dioxide, silicon carbide, etc.), or the like. Depending on the implementation, layer 322 may be configured to couple to a first circuit (e.g., circuit 102 of FIG. 1). The first circuit may include an integrated circuit such as a microprocessor, memory chip, digital signal processor, system-on-chip (SoC), or the like. In some examples, the first circuit may be characterized by a first CTE. For instance, the first circuit includes a silicon material and the first CTE may be less than 3 ppm/° C. In various implementations, substrate 800 may be characterized by a second CTE. For instance, a ratio of the first CTE to the second CTE is greater than or equal to 3:5. By closely matching the CTEs of substrate 800 and the first circuit, the risks associated with thermal stresses-such as warping or delamination—may be significantly mitigated, enhancing both the reliability and longevity of the semiconductor device.

Depending on the implementation, a first connection may be formed in layer 322. The first connection may be configured to facilitate electrical, thermal, or mechanical connections between substrate 800 and other components. As shown in FIG. 8, the first connection includes a metal bump 324, which may be used to establish connections between 800 and the first circuit. For example, metal bump 324 may be made from various materials including, without limitation, copper, tin, lead, aluminum, gold, or the like. In some cases, metal bump 324 includes one or more uBumps. By integrating metal bump 324 within layer 322, substrate 800 can provide fine pitch, high density, and low parasitic interconnection for high-performance electronic packages.

Figure 9:
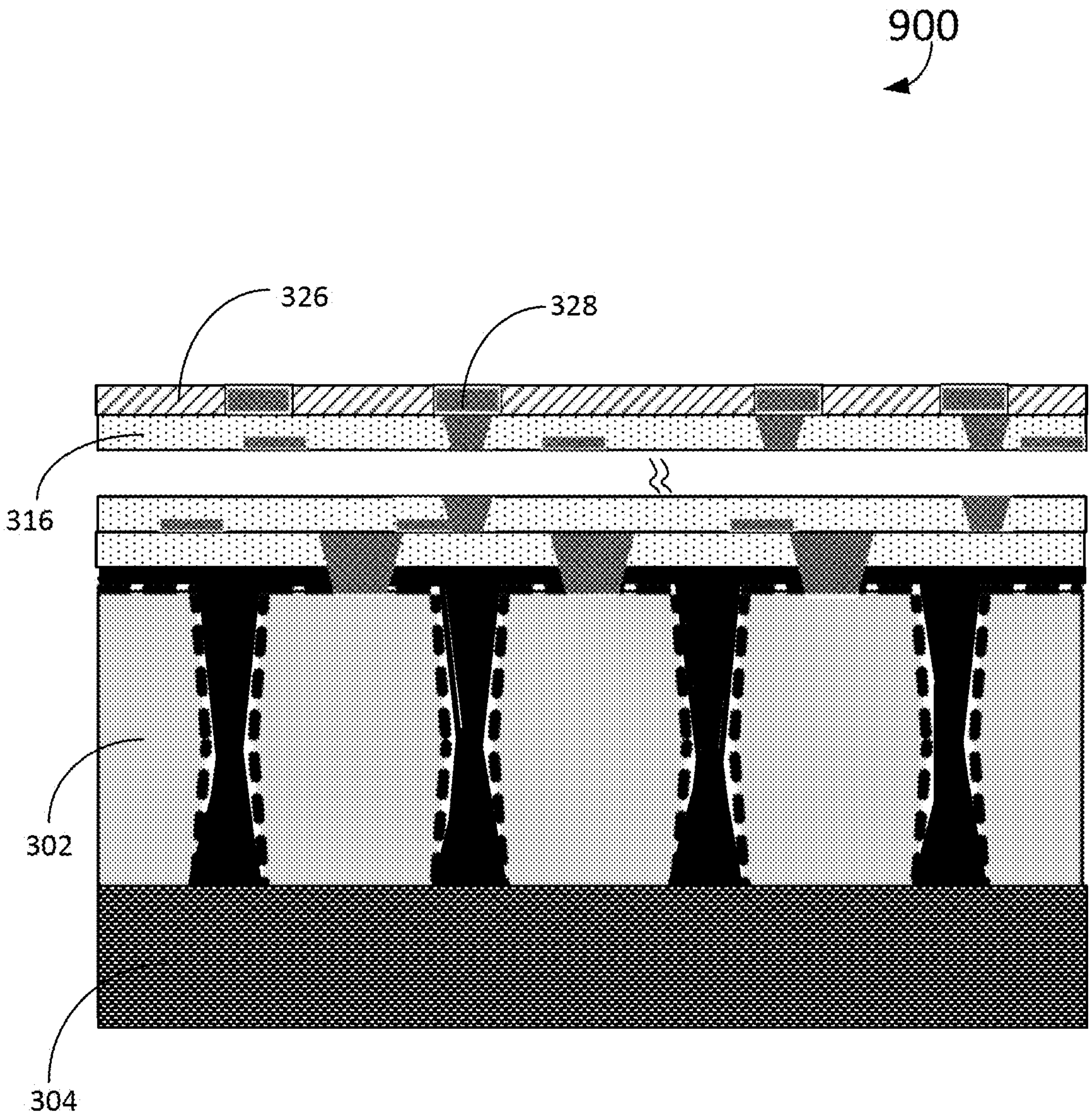
FIG. 9 is a simplified diagram illustrating a passivation layer of a semiconductor substrate according to embodiments of the subject technology.

FIG. 9 is a simplified diagram illustrating a passivation layer of a semiconductor substrate 900 according to embodiments of the subject technology. This diagram is merely an example, which should not unduly limit the scope of the claims. One of ordinary skill in the art would recognize many variations, alternatives, and modifications. As shown in FIG. 9, layer 326 may be deposited on layer 316. For instance, layer 326 may be configured to provide protection for the underlying substrate and improve the electrical performance of the semiconductor device. In some embodiments, layer 326 may include a dielectric material, which may include, without limitation, one or more materials such as an organic material (e.g., polyimide, parylene, benzocyclobutene, etc.), an inorganic material (e.g., silicon nitride, silicon dioxide, silicon carbide, etc.), or the like.

Depending on the implementation, a first connection may be formed in layer 326. The first connection may be configured to facilitate electrical, thermal, or mechanical connections between substrate 900 and other components. As shown in FIG. 9, the first connection includes a conductive pad 328, which may include various materials such as copper, gold, silver, aluminum, tin, or the like. In some examples, conductive pad 328 may include a hybrid copper bonding pad, which combines a dielectric bond with a metal bond to form interconnections between substrate 900 and the first circuit. Hybrid copper bonding may include bonding between copper or other metals (e.g., gold, etc.) and dielectric materials, which can be organic (e.g., small molecules or monomers, etc.) or inorganic (e.g., silicon oxide, other metal oxides, etc.). For instance, conductive pad 328 may be embedded in layer 326 to provide electrical, thermal, or mechanical connections between substrate 900 and the first circuit, providing high connection densities with narrow pitches (e.g., below 10 um) for high-performance applications.

Figure 10:
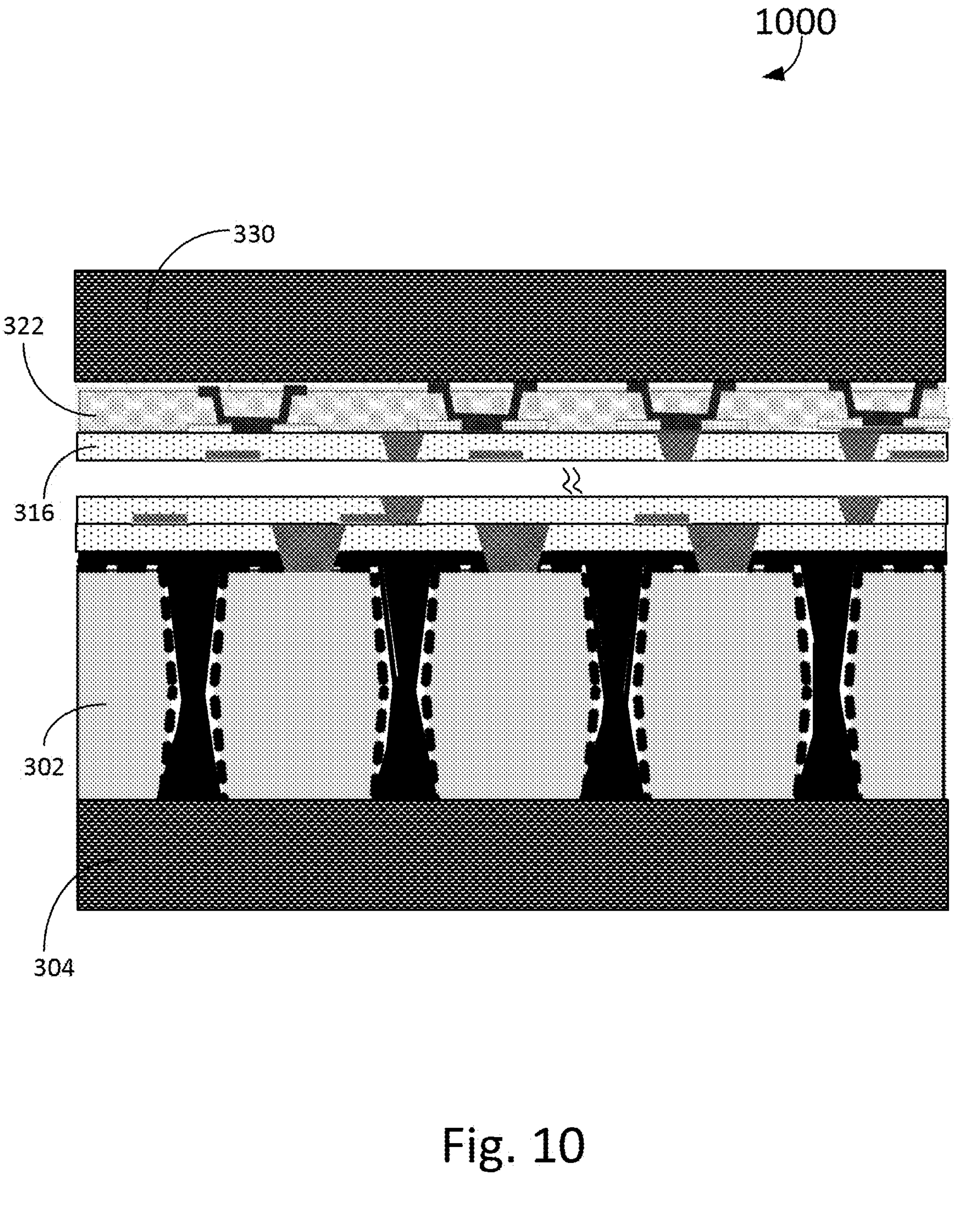
FIG. 10 is a simplified diagram illustrating one or more wafers coupling a semiconductor substrate according to embodiments of the subject technology.

FIG. 10 is a simplified diagram illustrating one or more wafers coupling a semiconductor substrate 1000 according to embodiments of the subject technology. This diagram is merely an example, which should not unduly limit the scope of the claims. One of ordinary skill in the art would recognize many variations, alternatives, and modifications.

As previously noted, substrate 1000 may be characterized by an asymmetrical configuration with two or more regions (e.g., first region 228 and second region 230 of FIG. 2) having distinct properties or configurations. For instance, a first region may be fabricated based on one or more processes illustrated in FIGS. 3-9. The first region may be characterized by features associated with silicon interposers, which provide fine-pitched electrical interconnects, enabling high-density routing and efficient connections across the semiconductor device. To facilitate the fabrication of the asymmetrical structure, the fabrication of substrate 1000 may be achieved by masking one side, processing the other, and then repeating a similar process on the other side. For instance, a second wafer (e.g., wafer 330) may be used to form a second region after the first region has been processed. The second region of substrate 1000 may have different properties or configurations than the first region. In some examples, the second region may be characterized by features associated with organic substrates, which provide flexibility and enhanced thermal management capabilities, allowing for seamless integration of both passive and active components.

In various implementations, wafer 330 may be coupled to substrate 1000 (e.g., the first side of substrate 1000). For example, wafer 330 may be coupled to layer 322. In certain cases, one or more components (e.g., electronic or semiconductor elements) may be mounted onto substrate 1000 before coupling wafer 330. The integration of these components may be achieved using various techniques including, without limitation, thermal compression bonding (TCB), hybrid copper bonding (HCB), fusion bonding, or the like. Depending on the implementation, subsequent molding and/or planarization processes may be performed to encapsulate and smooth the surface of the bonded components.

According to some embodiments, wafer 330 may be coupled to a side different from that of wafer 304. For instance, wafer 330 is coupled to the first side, and wafer 304 is coupled to the second side, or vice versa. In some cases, the first side and the second side are opposite each other. As an example, wafer 330 includes a carrier wafer, which may be configured to provide structural rigidity and support for the formation and processing of semiconductor substrate 1000. Wafer 330 may be coupled to substrate 1000 by adhesive and/or other mechanisms. In various examples, wafer 330 may include one or more materials such as organic material, core material, glass material, and/or the like. Depending on the particular application, wafer 330 may possess attributes such as heat dissipation capabilities, identification codes, alignment marks, or other features.

Figure 11:
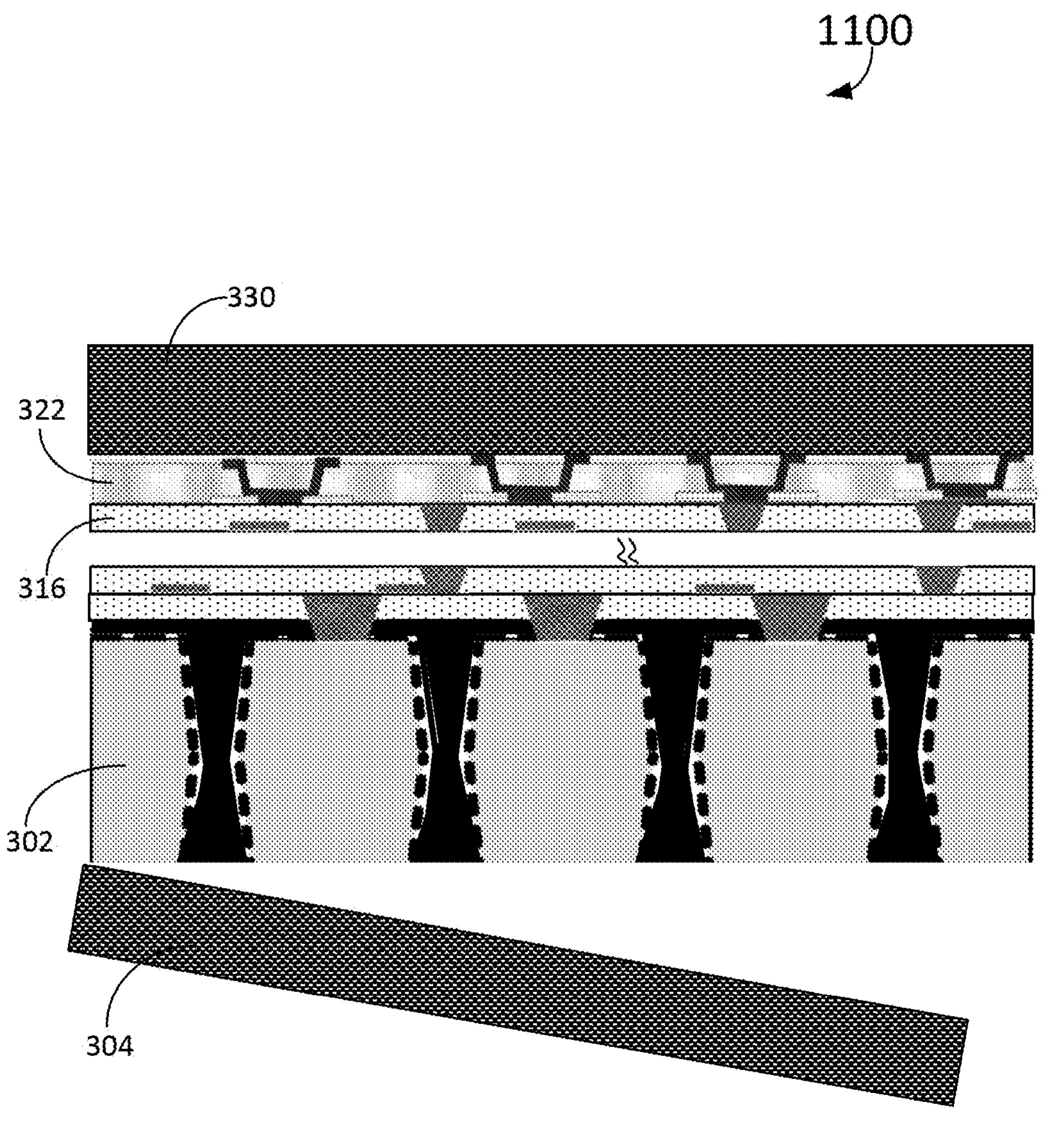
FIG. 11 is a simplified diagram illustrating a process of detaching a wafer from a semiconductor substrate according to embodiments of the subject technology.

FIG. 11 is a simplified diagram illustrating a process of detaching a wafer from a semiconductor substrate 1100 according to embodiments of the subject technology. This diagram is merely an example, which should not unduly limit the scope of the claims. One of ordinary skill in the art would recognize many variations, alternatives, and modifications. As illustrated, wafer 304 may be detached from substrate 1100. Depending on the implementation, wafer 304 may be detached from substrate 1100 using various methods, which may involve weakening the adhesion between wafer 304 and substrate 1100 by applying a solvent, a laser beam, heat, an electric field, or the like. In certain embodiments, wafer 304 may be coupled to substrate 1100 using adhesives and can be detached through mechanical and/or chemical processes. After detaching wafer 304, the second side of substrate 1100 may be exposed for subsequent processing and integration.

Figure 12:
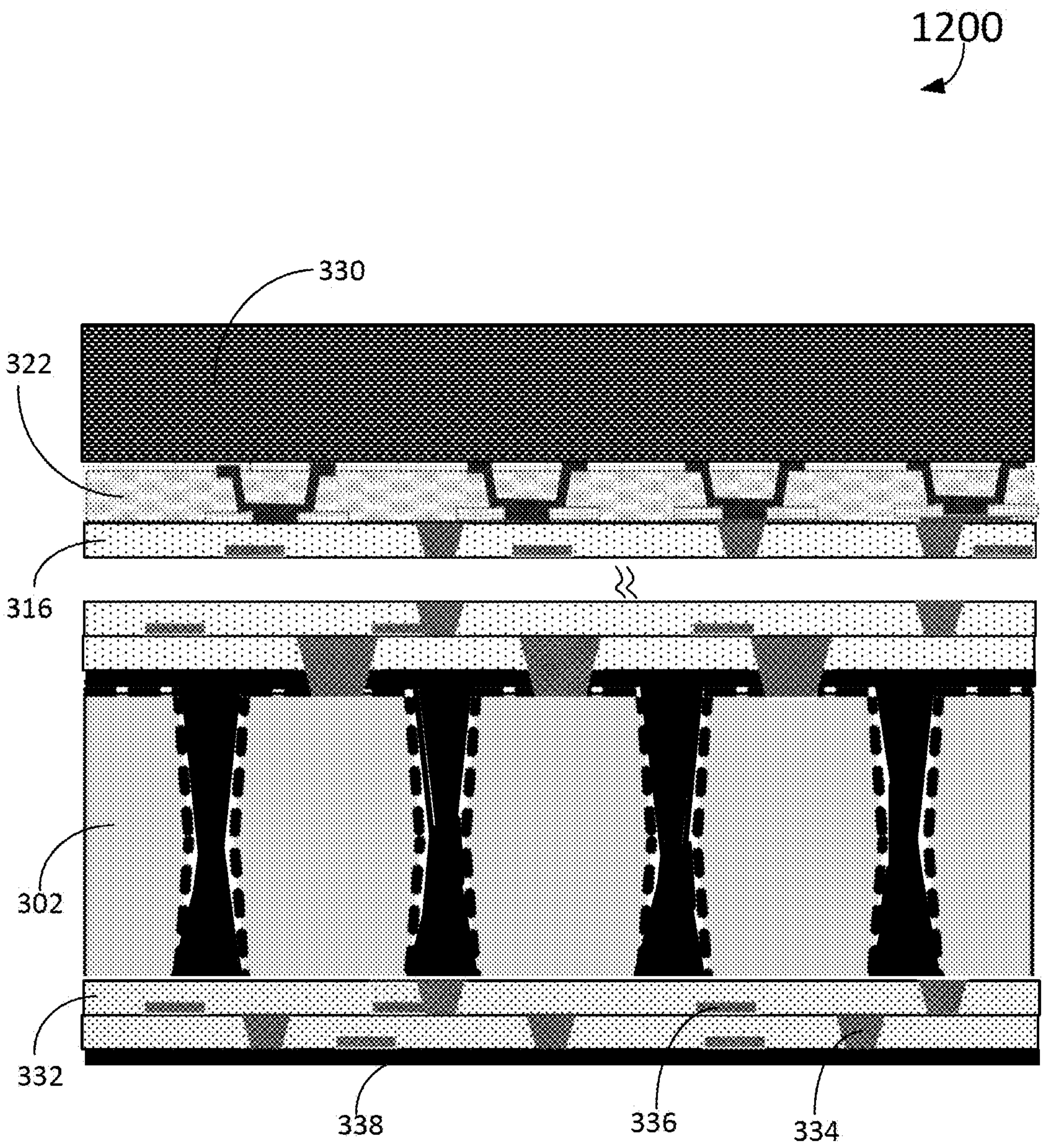
FIG. 12 is a simplified diagram illustrating one or more dielectric layers of a semiconductor substrate according to embodiments of the subject technology.

FIG. 12 is a simplified diagram illustrating one or more dielectric layers of a semiconductor substrate 1200 according to embodiments of the subject technology. This diagram is merely an example, which should not unduly limit the scope of the claims. One of ordinary skill in the art would recognize many variations, alternatives, and modifications. As shown, after the removal of wafer 304, layer 322 may be deposited on based layer 302 (e.g., the second side of base layer 302). Layer 332 may be configured to provide electrical insulation between different components. For instance, layer 332 may include a dielectric layer. Layer 332 may include a second dielectric material, which includes, without limitation, one or more materials such as an organic material (e.g., build-up film, polyimide, or other polymer-based dielectrics), an inorganic material (e.g., silicon nitride, silicon dioxide, silicon carbide, etc.), or the like. In some cases, the second dielectric material may be different from the first dielectric material of layer 316. Depending on the implementation, layer 332 may be formed using various techniques including, without limitation, CVD, PVD, ALD, or the like.

In various implementations, a second wiring may be formed in layer 332 to provide various functions and capabilities, such as signal transmission, power distribution, heat dissipation, or the like. The second wiring may be made using a variety of materials including, without limitation, one or more materials such as copper, aluminum, gold, or the like. For instance, the second wiring may include via 334, which may be filled with various materials including, without limitation, copper, aluminum, gold, or the like. Via 334 may be configured to establish vertical connections among different components, allowing for seamless electrical communication within the semiconductor device. Via 334 may be formed using various techniques, such as photolithography and etching, laser drilling, damascene, or the like. The number and configuration of the vias may depend on the specific implementation. For example, via 334 may include a straight, sloped, angled, curved, or stepped sidewall. In some cases, a tapering ratio of via 334 can vary between 80% and 100%.

It is to be appreciated that the composition, thickness, and number of dielectric layers can be tailored to meet specific requirements and may differ depending on the application. For example, one or more layers 332 may be formed. The multiple layers may be stacked on top of each other. In some embodiments, the second wiring may include conductive trace 336. For instance, conductive trace 336 may be configured to establish horizontal electrical connections along layer 332. Conductive trace 336 may include, without limitation, one or more materials such as copper, aluminum, gold, or the like. The dimensions and configurations (e.g., width, length, or thickness) of conductive trace 336 may vary depending on the application. Conductive trace 336 may be formed using various techniques, such as photolithography and etching, laser drilling, damascene, or the like. In various implementations, via 334 and conductive trace 336 may be strategically coordinated to ensure consistent signal transmission and efficient power delivery within the semiconductor device. For instance, via 334 may connect conductive trace 336 among different layers. Such a configuration permits electrical signals to seamlessly transition between layers, facilitating advanced multilayer circuit design and 3D integration. In some cases, an endpoint of conductive trace 336 may overlap or be in close proximity to via 334, which enhances connection reliability and minimizes risks like short-circuit or signal interference.

In some embodiments, layer 338 may be deposited on layer 332. For instance, layer 338 may include a solder resist material, which may be configured to protect the semiconductor device from solder and other contaminants. Solder resist materials may include, without limitation, one or more materials such as epoxy resin, acrylate resin, polyimide resin, or the like. In some cases, layer 338 may be patterned to expose the areas where soldering is required, allowing substrate 1300 to be coupled to other components (e.g., a printed circuit board). Depending on the implementation, layer 338 may be deposited using various techniques including, without limitation, screen printing, spray coating, or the like.

Figure 13:
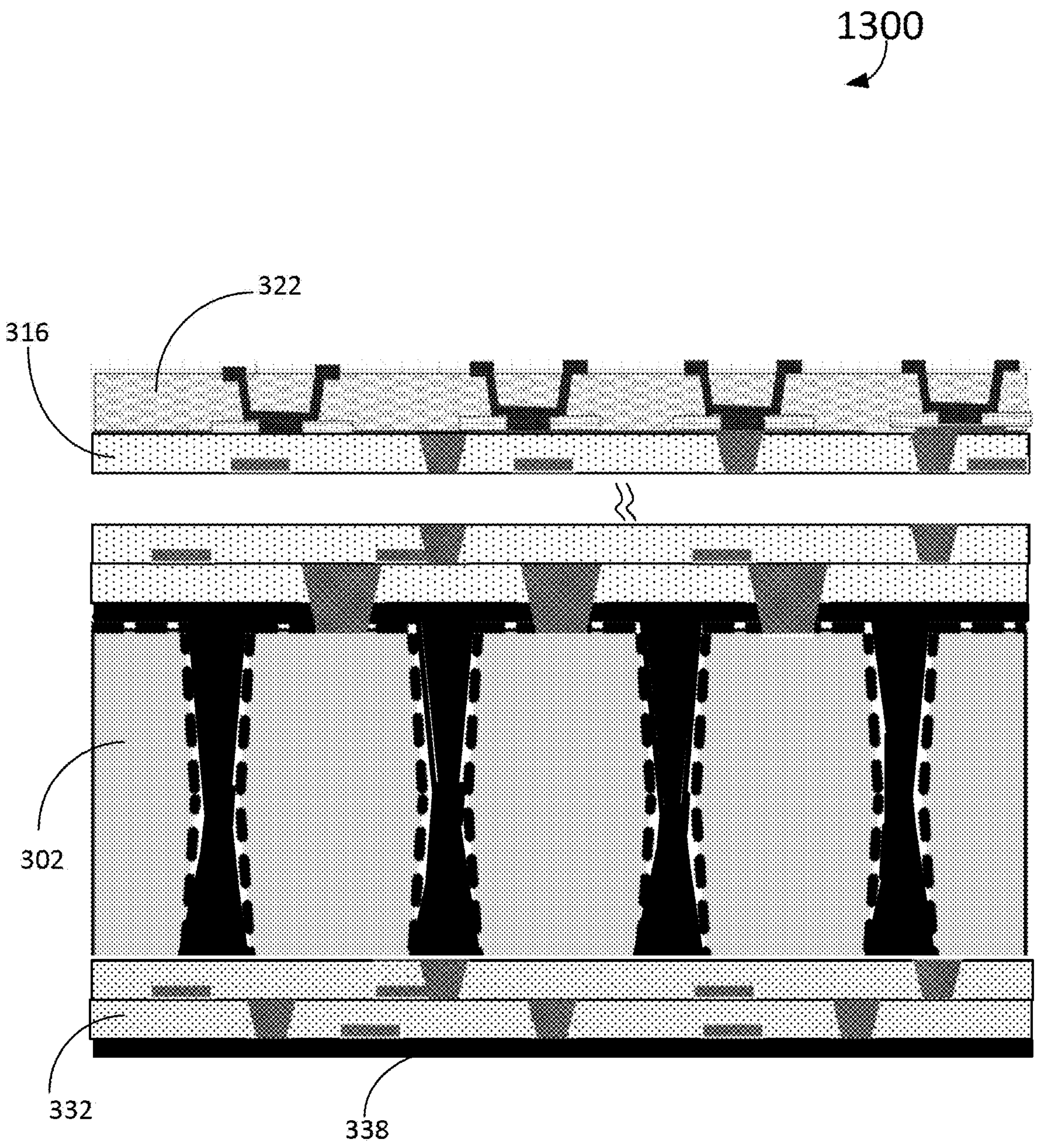
FIG. 13 is a simplified diagram illustrating a process of detaching a wafer from a semiconductor substrate according to embodiments of the subject technology.

FIG. 13 is a simplified diagram illustrating a process of detaching a wafer from a semiconductor substrate 1300 according to embodiments of the subject technology. This diagram is merely an example, which should not unduly limit the scope of the claims. One of ordinary skill in the art would recognize many variations, alternatives, and modifications. As previously noted, substrate 1300 may be characterized by an asymmetrical configuration with two or more regions (e.g., first region 228 and second region 230 of FIG. 2) having distinct properties or configurations. For instance, a second region may be fabricated based on one or more processes illustrated in FIGS. 10-13. The second region of substrate 1300 may have different properties or configurations than the first region. In some examples, the second region may be characterized by features associated with organic substrates, which provide flexibility and enhanced thermal management capabilities, allowing for seamless integration of both passive and active components.

As shown in FIG. 13, wafer 330 may be detached from substrate 1300 after the second region has been processed. Depending on the implementation, wafer 330 may be detached from substrate 1300 using various methods, which may involve weakening the adhesion between wafer 330 and substrate 1300 by applying a solvent, a laser beam, heat, an electric field, or the like. In certain embodiments, wafer 330 may be coupled to substrate 1300 using adhesives and can be detached through mechanical and/or chemical processes.

Figure 14A:
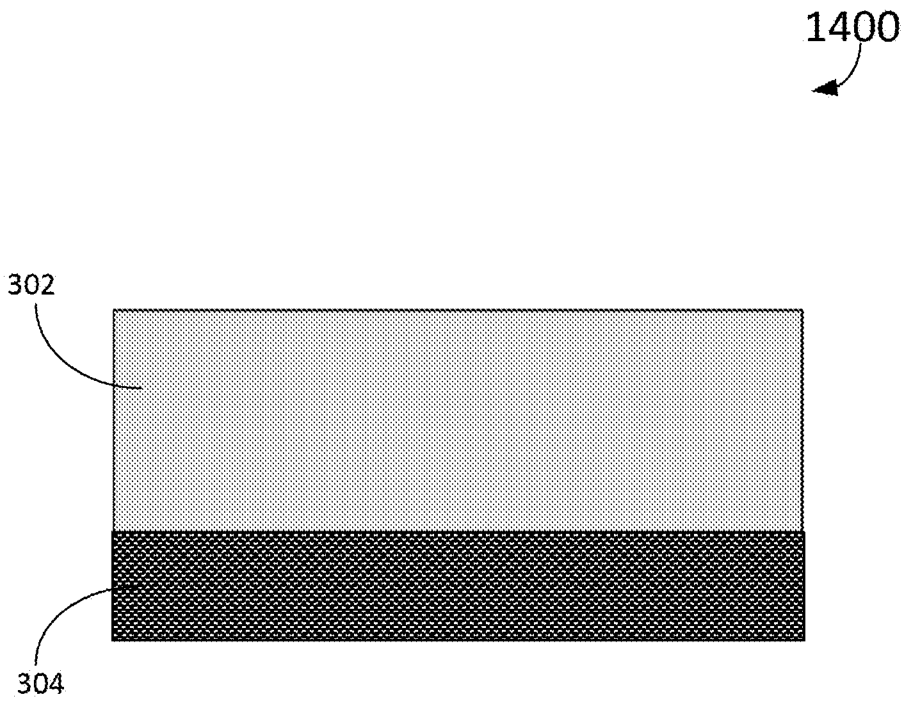
FIGS. 14A-14B are simplified diagrams illustrating a base layer of a semiconductor substrate according to embodiments of the subject technology.
Figure 14B:
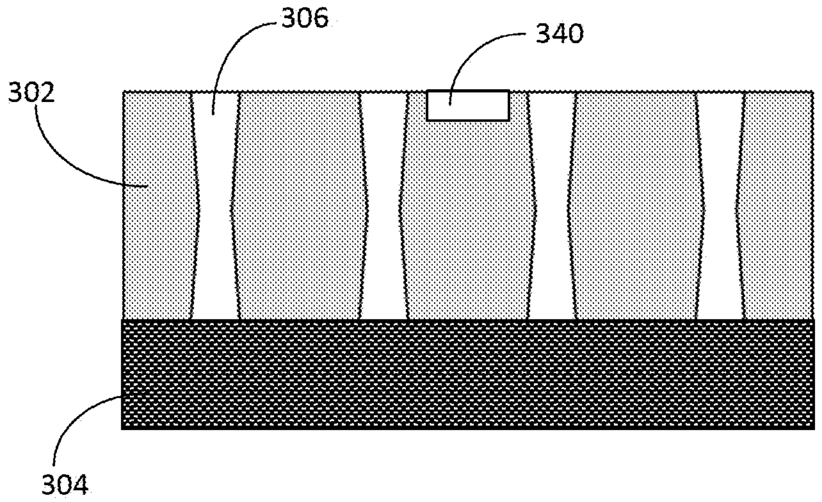

FIGS. 14A-14B are simplified diagrams illustrating a base layer of a semiconductor substrate 1400 according to embodiments of the subject technology. These diagrams are merely examples, which should not unduly limit the scope of the claims. One of ordinary skill in the art would recognize many variations, alternatives, and modifications. As shown in FIG. 14A, base layer 302 is coupled to wafer 304. For instance, wafer 304 may be coupled to base layer 302 by adhesive and/or other mechanisms. Base layer 302 may include, without limitation, at least one or more materials such as glass, glass composite, ceramic, diamond, diamond composite, silicon, or the like. As an example, base layer 302 includes a first side (e.g., a front or top side) and a second side (e.g., a back or bottom side). Depending on the implementation, wafer 304 may be coupled to the first side or the second side. A thickness of base layer 302 can be adjusted according to the design and function of the semiconductor device. In various examples, base layer 302 is characterized by a thickness of greater than 100 um and less than 2000 um.

As shown in FIG. 14B, via 306 may be formed in base layer 302. Via 306 may be configured to provide various functions including, without limitation, vertical interconnection, signal transmission, power distribution, heat dissipation, mechanical support, or the like. The number and configuration of the vias may depend on the specific implementation. For example, via 306 may include a straight, sloped, angled, curved, or stepped sidewall. In certain embodiments, cavity 340 may be formed in base layer 302. Depending on the implementation, cavity 340 may be formed using various techniques, including, without limitation, laser drilling, punching, etching, molding, 3D printing, or the like. Cavity 340 may be used to integrate one or more components to enhance overall performance, as will be described later. The configuration (e.g., shape, size, depth, etc.) of cavity 340 may vary depending on the material of base layer 302, the component type, and/or the fabrication method.

Figure 15A:
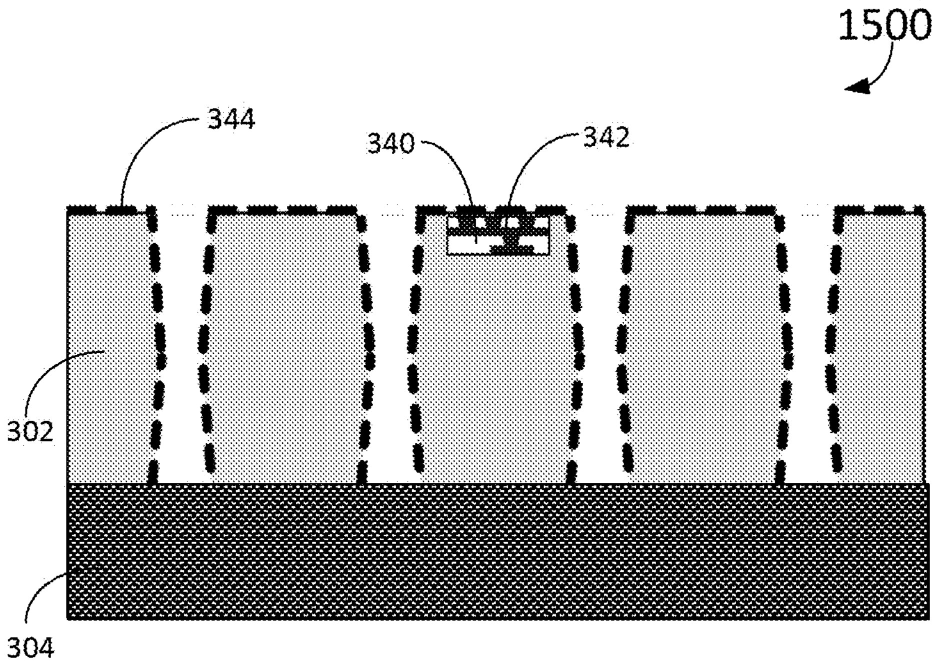
FIGS. 15A-15B are simplified diagrams illustrating a process of depositing one or more layers on a base layer of a semiconductor substrate according to embodiments of the subject technology.
Figure 15B:
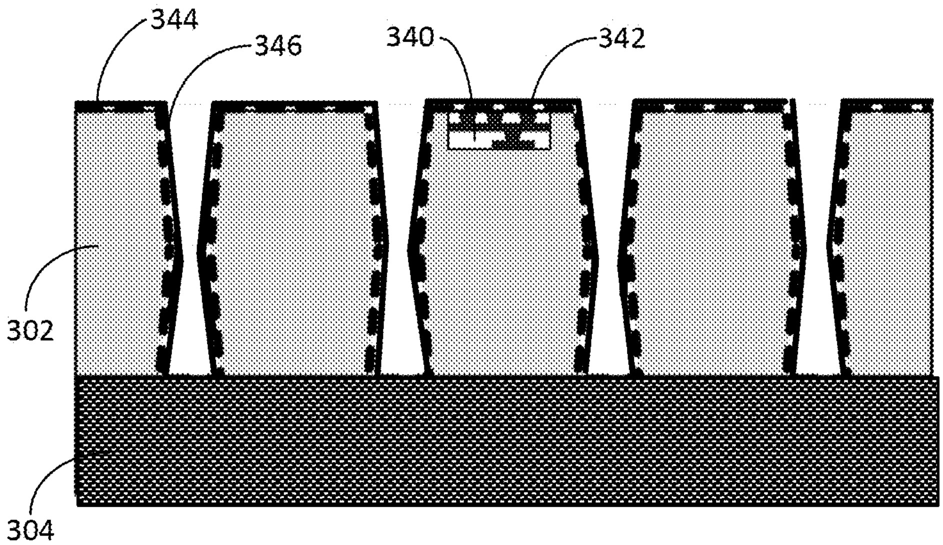

FIGS. 15A-15B are simplified diagrams illustrating a process of depositing one or more layers on a base layer of a semiconductor substrate 1500 according to embodiments of the subject technology. These diagrams are merely examples, which should not unduly limit the scope of the claims. One of ordinary skill in the art would recognize many variations, alternatives, and modifications. As shown in FIG. 15A, circuit 342 may be embedded in cavity 340. Depending on the implementation, circuit 342 may be embedded in cavity 340 using various techniques including, without limitation, adhesives, soldering, hybrid copper bonding, or the like. Circuit 342 may include, without limitation, a memory, a thermal component, a mechanical component, an optical component, an electrical component, or the like. For instance, circuit 342 may include one or more passive or active components such as waveguides, lenses, voltage regulators, or the like. This may conserve space on the outer layers, allowing for more efficient routing and reducing the necessity for additional layers.

In various implementations, after embedding circuit 342 in base layer 302, one or more layers may be deposited on base layer 302 to provide protection and facilitate subsequent processing. For instance, as shown in FIG. 15A, layer 344 may be deposited on base layer 302. Layer 344 may include a seed layer, which is configured to facilitate copper deposition to ensure optimal connectivity and conductivity within substrate 1500. Layer 344 may serve as a template for the subsequent electroplating or electroless plating of metal to fill via 306. Depending on the implementation, layer 344 may be one or more layers, which may include, one or more materials such as titanium nitride, tungsten, silicon oxide, copper, gold, nickel, or the like. Depending on the desired thickness and uniformity, layer 344 may be deposited using various techniques including, without limitation, PVD, CVD, ALD, or the like. In some cases, layer 344 includes a barrier layer, which is configured to prevent the diffusion of metal atoms into the base layer, which can cause electrical shorting or reliability issues. For example, the barrier layer may include, without limitation, tantalum, tantalum nitride, titanium, titanium nitride, or the like.

In some embodiments, layer 346 may be deposited on layer 344. For instance, layer 346 may include a via-electroplated layer, which may be deposited on the walls of a via (e.g., via 306 of FIG. 14B) by using an electrochemical process. For instance, layer 346 may be deposited via an electroplating process, in which a conductive metallic film is deposited by the reduction of a metal ion from a solution onto a conductive surface (e.g., layer 344). Layer 346 may be configured to create a conductive path between different layers and to fill via 306 with metal materials. This can improve the electrical performance, reliability, and thermal management of the semiconductor device. Layer 346 may include, without limitation, one or more materials such as copper, organic resin, or the like.

While the above is a full description of the specific embodiments, various modifications, alternative constructions and equivalents may be used. Therefore, the above description and illustrations should not be taken as limiting the scope of the subject technology which is defined by the appended claims.

What is claimed is:

1. A method for manufacturing a semiconductor device, the method comprising:

forming a substrate; and coupling a first circuit to the substrate, the first circuit being characterized by a first coefficient of thermal expansion, the substrate being characterized by a second coefficient of thermal expansion, a ratio of the first coefficient of thermal expansion to the second coefficient of thermal expansion is greater than or equal to 3:5;

wherein forming the substrate comprises:

providing a base layer, the base layer comprising a first side and a second side;

coupling a first wafer to the second side;

forming a first via in the base layer;

depositing a first layer on the first side, the first layer comprising a first dielectric material;

forming a first wiring in the first layer;

depositing a second layer on the first layer;

forming a first connection in the second layer, the first circuit being coupled to the substrate via the first connection;

coupling a second wafer to the second layer;

detaching the first wafer from the base layer; and after detaching the first wafer from the base layer, depositing a third layer on the second side, the third layer comprising a second dielectric material.

2. The method of claim 1, wherein the first connection comprises a conductive pad.

3. The method of claim 1, wherein the first connection comprises a metal bump.

4. The method of claim 1, wherein:

the substrate is characterized by a first thickness;

the base layer is formed from at least one of a glass material, a ceramic material, or a diamond material and is characterized by a second thickness; and the second thickness is greater than 60% of the first thickness.

5. The method of claim 1, wherein the base layer comprises a glass material, a ceramic material, a diamond material, or a silicon material.

6. The method of claim 1, further comprising:

depositing a fourth layer on the substrate, the fourth layer being coupled to the first via.

7. The method of claim 6, wherein the third layer comprises a titanium nitride material, a tungsten material, a silicon oxide material, or a copper material.

8. The method of claim 1, wherein the first dielectric material comprises a polyimide material or a silicon nitride material.

9. The method of claim 1, wherein the second layer comprises a passivation material.

10. The method of claim 1, wherein forming the first via in the base layer comprises drilling the base layer on the first side and the second side.

11. The method of claim 10, wherein drilling the base layer of the first side and the second side causes the first via to taper toward a middle of the first via.

12. The method of claim 1, wherein the second dielectric material is different from the first dielectric material.

13. The method of claim 1, further comprising forming a second wiring in the fourth layer, the second wiring comprising a metal material.

14. A method for manufacturing a semiconductor device, the method comprising:

forming a substrate; and coupling a first circuit to the substrate, the first circuit being characterized by a first coefficient of thermal expansion, the substrate being characterized by a second coefficient of thermal expansion, a ratio of the first coefficient of thermal expansion to the second coefficient of thermal expansion is greater than or equal to 3:5;

wherein forming the substrate comprises:

providing a base layer, the base layer comprising a first side and a second side;

coupling a first wafer to the second side;

forming a first via in the base layer;

forming a cavity in the base layer, the cavity being positioned on the first side;

embedding a second circuit in the cavity;

depositing a first layer on the first side, the first layer comprising a first dielectric material;

forming a first wiring in the first layer;

depositing a second layer on the first layer;

forming a first connection in the second layer, the first circuit being coupled to the substrate via the first connection;

coupling a second wafer to the second layer;

detaching the first wafer from the base layer; and after detaching the first wafer from the base layer, depositing a third layer on the second side, the third layer comprising a second dielectric material.

15. The method of claim 14, wherein the second circuit comprises a memory, a thermal component, a mechanical component, an optical component, or an electrical component.

16. The method of claim 14, wherein:

the substrate is characterized by a first thickness;

the base layer is characterized by a second thickness; and the second thickness is greater than 60% of the first thickness.

17. The method of claim 14, wherein the first layer is characterized by a third thickness, the third thickness is less than or equal to 30 um.

18. The method of claim 14, wherein the base layer comprises a glass material, a ceramic material, a diamond material, or a silicon material.

19. A method for manufacturing a semiconductor device, the method comprising:

providing a base layer, the base layer comprising a first side and a second side;

coupling a first wafer to the second side;

forming a first via in the base layer;

depositing a first layer on the first side, the first layer comprising a first dielectric material;

forming a first wiring in the first layer; and depositing a second layer on the first layer;

coupling a second wafer to the second layer;

detaching the first wafer from the base layer; and after detaching the first wafer from the base layer, depositing a third layer on the second side, the third layer comprising a second dielectric material.

20. The method of claim 19, further comprising embedding a circuit in the base layer.

* * * * *